(12) United States Patent
Okinaka et al.

(10) Patent No.: US 7,952,269 B2
(45) Date of Patent: May 31, 2011

(54) ORGANIC LIGHT-EMITTING DEVICE

(75) Inventors: Keiji Okinaka, Kawasaki (JP);
Masataka Yashima, Tokyo (JP);
Akihito Saitoh, Yokohama (JP); Naoki Yamada, Tokyo (JP); Akihiro Senoo, Kawasaki (JP); Kazunori Ueno, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 469 days.

(21) Appl. No.: 11/274,140

(22) Filed: Nov. 16, 2005

(65) Prior Publication Data
US 2006/0113528 A1    Jun. 1, 2006

(30) Foreign Application Priority Data

Nov. 26, 2004  (JP) .................................. 2004-342462

(51) Int. Cl.
*H01L 51/54* (2006.01)
*C09K 11/06* (2006.01)

(52) U.S. Cl. ... 313/504; 313/506; 257/40; 257/E51.047; 257/E51.049; 257/E51.051; 428/690; 428/917

(58) Field of Classification Search .................. 428/690, 428/917; 313/502–509; 585/24–27; 564/308, 564/426–427, 433–434
See application file for complete search history.

(56) References Cited

U.S. PATENT DOCUMENTS

| | | | | |
|---|---|---|---|---|
| 4,539,507 A | 9/1985 | VanSlyke et al. | ............. | 313/504 |
| 4,720,432 A | 1/1988 | VanSlyke et al. | ............. | 428/457 |
| 4,769,292 A | * 9/1988 | Tang et al. | .................... | 428/690 |
| 4,885,211 A | 12/1989 | Tang et al. | .................... | 428/457 |

(Continued)

FOREIGN PATENT DOCUMENTS

JP           02-247278          10/1990
(Continued)

OTHER PUBLICATIONS

Machine Translation of JP 2005-206551.*
(Continued)

*Primary Examiner* — D. Lawrence Tarazano
*Assistant Examiner* — Brett A Crouse
(74) *Attorney, Agent, or Firm* — Fitzpatrick, Cella, Harper & Scinto

(57) ABSTRACT

An organic light-emitting device is provided which has an optical output with a high efficiency, a high luminance and a long life and which includes a pair of electrodes including an anode and a cathode, and at least one layer comprising an organic compound provided between the pair of electrodes, wherein at least one layer having a light-emitting region of the at least one layer comprising the organic compound comprises a first compound represented by the general formula (1):

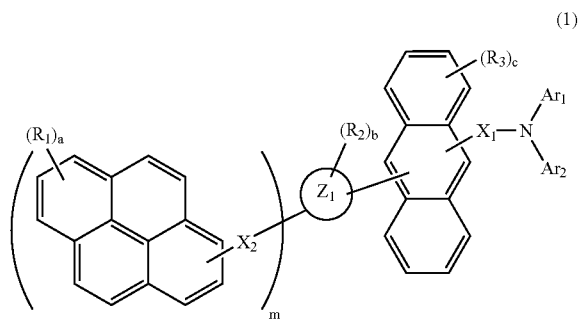

and a second compound having a bandgap larger than a bandgap of the first compound.

1 Claim, 2 Drawing Sheets

U.S. PATENT DOCUMENTS

| | | | |
|---|---|---|---|
| 5,130,603 A | 7/1992 | Tokailin et al. | 313/504 |
| 5,151,629 A | 9/1992 | VanSlyke | 313/504 |
| 5,227,252 A | 7/1993 | Murayama et al. | 428/690 |
| 5,247,190 A | 9/1993 | Friend et al. | 257/40 |
| 5,317,169 A | 5/1994 | Nakano et al. | 257/40 |
| 5,382,477 A | 1/1995 | Saito et al. | 428/690 |
| 5,409,783 A | 4/1995 | Tang et al. | 428/690 |
| 5,514,878 A | 5/1996 | Holmes et al. | 257/40 |
| 5,635,308 A | 6/1997 | Inoue et al. | 428/690 |
| 5,672,678 A | 9/1997 | Holmes et al. | 528/373 |
| 5,726,457 A | 3/1998 | Nakano et al. | 257/40 |
| 5,759,444 A | 6/1998 | Enokida et al. | 252/301.16 |
| 6,093,864 A | 7/2000 | Tokailin et al. | 585/25 |
| 6,251,531 B1 | 6/2001 | Enokida et al. | 428/690 |
| 6,713,192 B2 | 3/2004 | Fukuoka et al. | 428/690 |
| 2002/0048688 A1 | 4/2002 | Fukuoka et al. | 428/690 |
| 2004/0263067 A1 | 12/2004 | Saitoh et al. | 313/504 |
| 2006/0115678 A1 | 6/2006 | Saitoh et al. | 428/690 |

FOREIGN PATENT DOCUMENTS

| | | | |
|---|---|---|---|
| JP | 03-255190 | | 11/1991 |
| JP | 04-145192 | | 5/1992 |
| JP | 05-202356 | | 8/1993 |
| JP | 05-247460 | | 9/1993 |
| JP | 08-012600 | | 1/1996 |
| JP | 09-157643 | | 6/1997 |
| JP | 09157643 A | * | 6/1997 |
| JP | 09-202878 | | 8/1997 |
| JP | 09-227576 | | 9/1997 |
| JP | 10-072579 | | 3/1998 |
| JP | 11-008068 | | 1/1999 |
| JP | 3008897 | | 12/1999 |
| JP | 2000273056 A | * | 10/2000 |
| JP | 2001-284050 | | 10/2001 |
| JP | 2002-324678 | | 11/2002 |
| JP | 2004043349 | * | 2/2004 |
| JP | 2005206551 | * | 8/2005 |
| WO | WO 03080559 | * | 10/2003 |
| WO | WO 2004020388 | * | 3/2004 |

OTHER PUBLICATIONS

Machine Translation of JP 2004043349. (Feb. 2004).*
JP09-157643, Tamano et al., Machine Translation.*
JP2000-273056, Hosokawa et al., Machine Translation.*
CIE Color Space, Georgia State University, http://hyperphysics.phy-astr.gsu.edu/hbase/vision/cie.html, downloaded from the internet Jan. 6, 2010.*
Betzig et al., "Collection Mode Near-Field Scanning Optical Microscopy," *Appl. Phys. Lett.*, vol. 51, No. 25, 2088-2091 (1987).
Burroughes et al., "Light-Emitting Diodes Based on Conjugated Polymers," vol. 347, 539-541 (1990).

* cited by examiner

ORGANIC LIGHT-EMITTING DEVICE

BACKGROUND OF THE INVENTION

1. Field of the Invention

The present invention relates to a light-emitting device using an organic compound, and more particularly, relates to an organic light-emitting device which emits light by applying an electric field to a thin film comprising the organic compound.

2. Related Background Art

An organic light-emitting device is a device which forms excitons of a fluorescent organic compound by interposing a thin film comprising the fluorescent compound between an anode and a cathode and injecting electrons and holes (positive holes) from the electrodes, and utilizes light emitted when the excitons return to a ground state.

In a study according to Eastman Kodak Corporation in 1987 (Appl. Phys. Lett. 51, 913 (1987)), it has been reported that a device having a function-separated two-layer structure, which uses ITO for an anode, an alloy of magnesium and silver for a cathode, an aluminum quinolinol complex for an electron-transporting material and a light-emitting material and a triphenylamine derivative for a hole-transporting material, emits light of about 1,000 cd/m$^2$ at an applied voltage of about 10 V (U.S. Pat. Nos. 4,539,507, 4,720,432 and 4,885,211).

Further, emission of light from ultraviolet to infrared region can be performed by changing the kind of a fluorescent organic compound. In these days, research has been actively made on various compounds (U.S. Pat. Nos. 5,151,629, 5,409,783, 5,382,477, Japanese Patent Application Laid-Open Nos. H02-247278, H03-255190, H05-202356, H09-202878, and H09-227576).

In addition to organic light-emitting devices using such low-molecular materials as those described above, a group of the University of Cambridge has reported organic light-emitting devices using conjugate polymers (Nature, 347, 539 (1990)). This report has confirmed that light emission can be obtained by a single layer by forming polyphenylene vinylene (PPV) in a film shape by use of an application system. Related patents on the organic light-emitting device using the conjugate polymers include U.S. Pat. Nos. 5,247,190, 5,514,878, 5,672,678, and Japanese Patent Application Laid-Open Nos. H04-145192 and H05-247460.

As described above, recent progress of an organic light-emitting device is remarkable, and is characterized in that a highly responsive, thin, and lightweight light-emitting device that can be driven at a low applied voltage and provides a high luminance and a variety of emission wavelengths can be made, which suggests the applicability to a wide variety of uses.

However, there still remain a large number of problems in terms of durability such as a change over time due to long-term use and deterioration due to an atmospheric gas containing oxygen or to moisture. Furthermore, when application to a full-color display or the like is attempted, an optical output of a higher luminance or light emission of a higher conversion efficiency is still required at present, so that various proposals have been made hitherto.

As for an example of a material and an organic light-emitting device containing an anthracene ring, Japanese Patent Application Laid-Open No. H08-12600 discloses use of a phenyl anthracene derivative compound. The publication describes that such compound can form a good organic film because of its low crystallinity particularly when used for a blue-light-emitting material or an electron-injecting/transporting material, but the emission efficiency and durability life have not practically been sufficient.

Japanese Patent Application Laid-Open Nos. H09-157643 and H10-72579 disclose use of an aminoanthracene derivative and a diaminoanthracene derivative, respectively. The publications describe that those anthracene derivatives provide green light emission when used as a light-emitting material, but when used to make a device, the emission efficiency of the device has been low and the durability life of the device has not practically been sufficient.

Japanese Patent No. 3,008,897 discloses that a device using a particular bianthryl compound for a light-emitting material shows light emission of a high luminance, but has no description about its emission efficiency and durability life.

Japanese Patent Application Laid-Open No. H11-8068 discloses that a device using a particular anthracene compound containing an olefin moiety for a light-emitting material shows light emission of yellow to red color range, but the emission efficiency has not been practically sufficient.

Japanese Patent Application Laid-Open No. 2001-284050 discloses a device using a light-emitting medium layer containing an anthracene derivative of a particular structure, an electron-transporting compound and a fluorescent compound. The patent describes that a red-light-emitting device with improved reliability is obtained, but the emission efficiency is not practically sufficient and it is difficult to emit blue light because of its device structure.

Japanese Patent Application Laid-Open No. 2002-324678 discloses that an organic light-emitting device using a material which has a pyrene-substituted benzene ring has good emission characteristics and durability, but the external quantum efficiency of the device is low, and the patent has no specific description about the durability life.

SUMMARY OF THE INVENTION

It is, therefore, an object of the present invention to provide an organic light-emitting device having an optical output with a high efficiency, a high luminance and a long life.

The organic light-emitting device in accordance with the present invention comprises a pair of electrodes including an anode and a cathode, and at least one layer comprising an organic compound provided between the pair of electrodes, wherein at least one layer having a light-emitting region of the at least one layer comprising the organic compound comprises a first compound represented by the general formula (1):

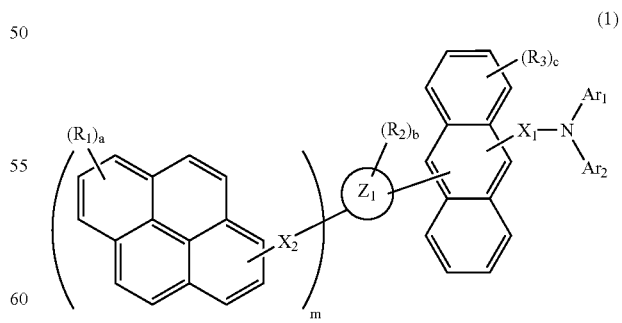

wherein $Ar_1$ and $Ar_2$ are each independently a group selected from the group consisting of substituted or unsubstituted aryl and heterocyclic groups, and may each be a group bonded through a linking group or be joined together to form a ring;

Z1 is a group selected from the group consisting of a direct single bond and substituted or unsubstituted alkylene, alkenylene, alkynylene, aralkylene, arylene, and divalent heterocyclic groups, and may be a group bonded through a linking group;

$X_1$ is a group selected from the group consisting of a direct single bond and substituted or unsubstituted arylene and divalent heterocyclic groups, and may be a group bonded through a linking group;

each $X_2$ is a group selected from the group consisting of a direct single bond and substituted or unsubstituted alkylene, alkenylene, alkynylene, aralkylene, arylene, and divalent heterocyclic groups, and may each be a group bonded through a linking group;

each $R_1$ and each $R_3$ is independently selected from the group consisting of a hydrogen atom, a deuterium atom, a halogen atom, and substituted or unsubstituted alkyl, aryl, alkoxy, and amino groups;

each $R_2$ is independently selected from the group consisting of a hydrogen atom, a deuterium atom, a halogen atom, and substituted or unsubstituted alkyl, aralkyl, alkenyl, alkynyl, alkoxy, sulfide, amino, aryl and heterocyclic groups;

a is an integer of 1 to 9;
b is an integer of 1 to 4;
c is an integer of 1 to 8; and
m is an integer of 1 to 3, and a second compound having a bandgap larger than a bandgap of the first compound.

The present invention can provide an organic light-emitting device which has extremely high luminance and efficiency, and excellent stability over time.

DESCRIPTION OF THE PREFERRED EMBODIMENTS

The present invention will be described in detail below.

FIGS. 1 to 5 are schematic cross-sectional views showing examples of configurations of the organic light-emitting device in accordance with the present invention.

Figure 1:
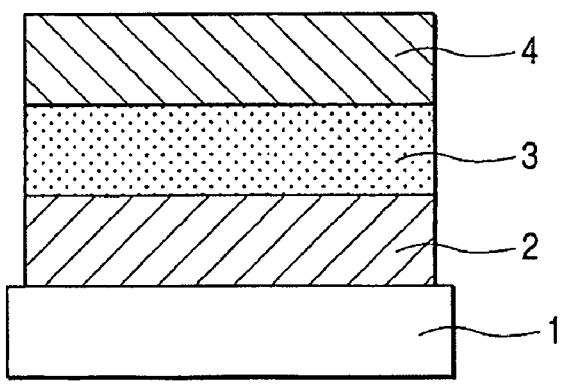
FIG. 1 is a schematic cross-sectional view showing an example of the organic light-emitting device in accordance with the present invention.

FIG. 1 shows a configuration in which an anode 2, a light-emitting layer 3 and a cathode 4 are sequentially provided on a substrate 1. The configuration is useful when the light-emitting layer itself owns all of hole transporting capability, electron transporting capability and light emitting capability.

Figure 2:
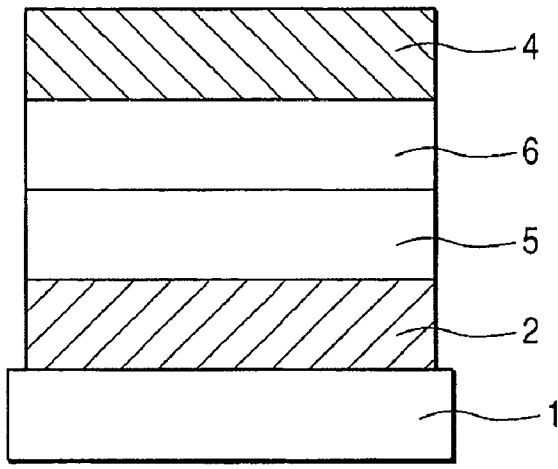
FIG. 2 is a schematic cross-sectional view showing another example of the organic light-emitting device in accordance with the present invention.

FIG. 2 shows a configuration in which an anode 2, a hole-transporting layer 5, an electron-transporting layer 6 and a cathode 4 are sequentially provided on a substrate 1. In this case, a light-emitting region is any one of the hole-transporting layer 5 and the electron-transporting layer 6. The configuration has a higher degree of freedom in selecting materials because the functions of hole transportation and electron transportation can be separated into the respective layers, and can improve the performance of the device.

Figure 3:
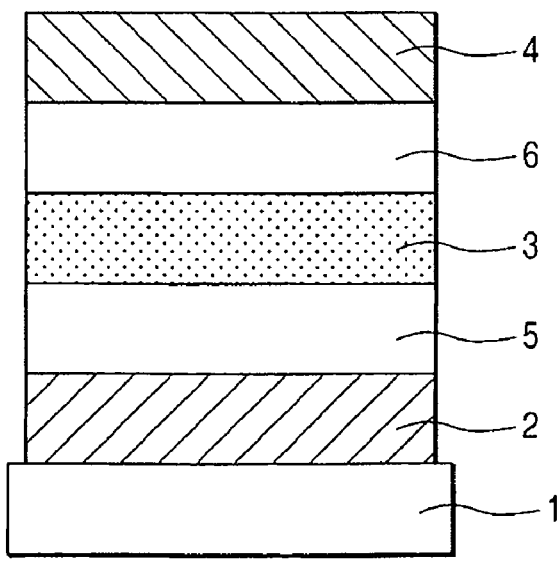
FIG. 3 is a schematic cross-sectional view showing still another example of the organic light-emitting device in accordance with the present invention.

FIG. 3 shows a configuration in which an anode 2, a hole-transporting layer 5, a light-emitting layer 3, an electron-transporting layer 6, and a cathode 4 are sequentially provided on a substrate 1. The configuration separates a carrier-transporting function and a light-emitting function, uses compounds having the characteristics of hole-transporting capability, electron-transporting capability and light-emitting capability respectively in combination, consequently extremely increases the degree of freedom in selecting materials, besides, can use various compounds having different emission wavelengths, and accordingly can emit lights of a variety of hues. Furthermore, the configuration makes it possible to effectively confine carriers or excitons in the central light-emitting layer 3, thereby improving the emission efficiency.

Figure 4:
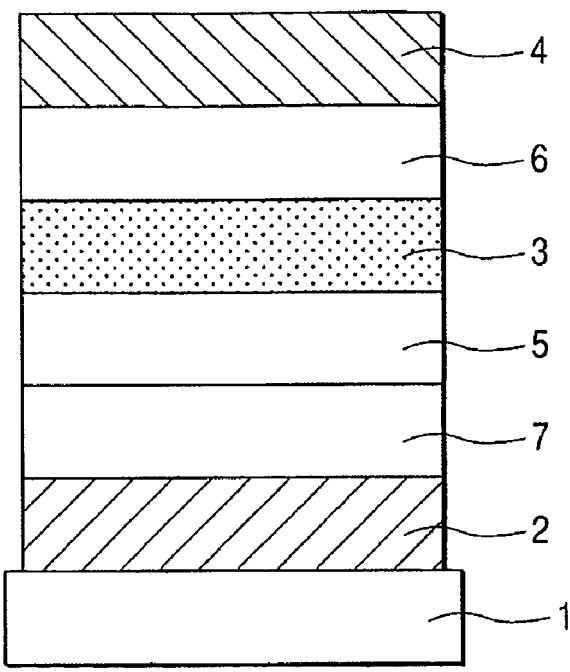
FIG. 4 is a schematic cross-sectional view showing yet another example of the organic light-emitting device in accordance with the present invention.

FIG. 4 shows a configuration in which a hole-injecting layer 7 is additionally provided an anode 2 side of the device structure shown in FIG. 3. The configuration has the effect of improving adhesiveness between the anode 2 and a hole-transporting layer 5 and improving hole injection property, thereby effectively reduce the drive voltage.

Figure 5:
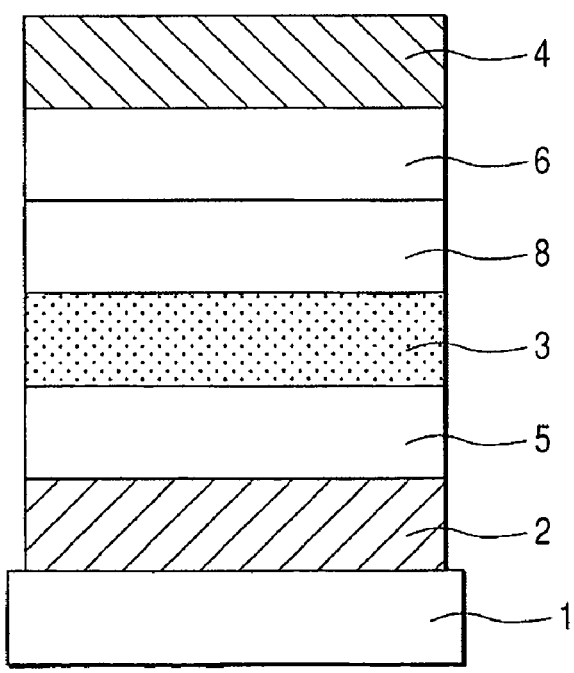
FIG. 5 is a schematic cross-sectional view showing yet still another example of the organic light-emitting device in accordance with the present invention.

FIG. 5 shows a configuration in which a layer (a hole/exciton blocking layer 8) for blocking holes or excitons from passing to a cathode 4 side is additionally provided between a light-emitting layer 3 and an electron-transporting layer 6 of the device structure shown in FIG. 3. The configuration effectively improves the emission efficiency by using a compound with a high ionization potential as the hole/exciton blocking layer 8.

The present invention is characterized in that at least one layer having a light-emitting region of the above described device configuration comprises a first compound represented by the above-mentioned general formula (1) and a second compound having a bandgap larger than that of the first compound, and a light emitted from the first compound is mainly utilized.

It is particularly desirable to select the both compounds such that an absorption wavelength region of the first compound overlaps an emission wavelength region of the second compound. Such selection makes it possible to promote energy transfer from the second compound to the first compound having a high emission efficiency, whereby improving the emission efficiency of the device. On the contrary, when the bandgap of the second compound is smaller than that of the first compound, the light emission the first compound having the high emission efficiency can not be efficiently utilized.

The advantages resulting from using the first compound and the second compound in combination, as compared to using the first compound singly include: (1) inhibition of concentration quenching due to association of the first compound, (2) improvement of film forming ability by mixing with the second compound, and (3) easy adjustment of carrier balance between electrons and holes by using the two kinds of compounds, and there is obtained the effect of improvement of the emission efficiency and prolongation of the life. In order to obtain the effect as described above, the concentration of the first compound in a layer having a light-emitting region is preferably 0.01 to 80 wt. %, and is particularly 1 to 40 wt. % in order to obtain the advantages of (1) to (3) in well balanced manner. The distribution of the concentration of the mixture of the both compounds may either be uniform or have a concentration gradient in the layer having the light-emitting region.

Further, for enhancing the above described advantages, it is possible to further add a third compound to the layer having the light-emitting region. Also in this case, it is important to select as the third compound a compound having a larger bandgap than that of the first compound.

Incidentally, the bandgap can be determined by measuring an absorption spectrum of a compound in ultraviolet to visible light region, or alternatively by measuring a reduction potential through a cyclic voltammetry method. Further alternatively, it can be predicted by means of a computer simulation through a molecular orbital method or a density functional method.

For the first compound, in consideration of providing to a same molecule a plurality of functions such as efficient light emission and efficient electron/hole transportation, molecular design has been carried out to dispose an aminoanthryl derivative group and a pyrene derivative group. As a result of introducing a substituted amino group into an anthryl group in expectation of high light emission efficiency and efficient hole-transporting capability, by changing a substituent in the amino group, it is possible to adjust the HOMO/LUMO levels of the material to thereby tune the emission color within a wide region including blue, green, and other colors on a longer wavelength side. Further, by predicting the HOMO/LUMO levels by calculation, it is possible to carry out molecular design while considering energy level differences of a host material, a hole-transporting layer, and an electron-transporting layer. The pyrene derivative shows a high quantum yield, and it can be also expected that superposition of pyrene rings improves the carrier-transporting capability. Furthermore, the amino group on the anthryl group can raise the glass transition temperature (Tg), and can provide a material with good thermal stability. For the first compound, in addition to the above described consideration, in the light of inhibiting molecular vibration and thermal inactivation through an isotope effect, introduction of a deuterium atom containing molecular unit has been also considered. The first compound has been made through molecular design on the basis of the above described consideration, and thus the present invention has been accomplished.

Examples of the substituted or unsubstituted alkyl group in the above described general formula (1) include, but are not limited to, methyl group, methyl-d1 group, methyl-d3 group, ethyl group, ethyl-d5 group, n-propyl group, n-butyl group, n-pentyl group, n-hexyl group, n-heptyl group, n-octyl group, n-decyl group, iso-propyl group, iso-propyl-d7 group, iso-butyl group, sec-butyl group, tert-butyl group, tert-butyl-d9 group, iso-pentyl group, neopentyl group, tert-octyl group, fluoromethyl group, difluoromethyl group, trifluoromethyl group, 2-fluoroethyl group, 2,2,2-trifluoroethyl group, perfluoroethyl group, 3-fluoropropyl group, perfluoropropyl group, 4-fluorobutyl group, perfluorobutyl group, 5-fluoropentyl group, 6-fluorohexyl group, chloromethyl group, trichloromethyl group, 2-chloroethyl group, 2,2,2-trichloroethyl group, 4-chlorobutyl group, 5-chloropentyl group, 6-chlorohexyl group, bromomethyl group, 2-bromoethyl group, iodomethyl group, 2-iodoethyl group, hydroxymethyl group, hydroxyethyl group, cyclopropyl group, cyclobutyl group, cyclopentyl group, cyclohexyl group, cyclopentylmethyl group, cyclohexylmethyl group, cyclohexylethyl group, 4-fluorocyclohexyl group, norbornyl group, and adamantyl group.

Examples of the substituted or unsubstituted aralkyl group include, but are not limited to, benzyl group, 2-phenylethyl group, 2-phenylisopropyl group, 1-naphthylmethyl group, 2-naphthylmethyl group, 2-(1-naphthyl)ethyl group, 2-(2-naphthyl)ethyl group, 9-anthrylmethyl group, 2-(9-anthryl)ethyl group, 2-fluorobenzyl group, 3-fluorobenzyl group, 4-fluorobenzyl group, 2-chlorobenzyl group, 3-chlorobenzyl group, 4-chlorobenzyl group, 2-bromobenzyl group, 3-bromobenzyl group, and 4-bromobenzyl group.

Examples of the substituted or unsubstituted alkenyl group include, but are not limited to, vinyl group, allyl group (2-propenyl group), 1-propenyl group, iso-propenyl group, 1-butenyl group, 2-butenyl group, 3-butenyl group and styryl group.

Examples of the substituted or unsubstituted alkynyl group include, but are not limited to, acetylenyl group, phenylacetylenyl group and 1-propynyl group.

Examples of the substituted or unsubstituted aryl group include, but are not limited to, phenyl group, phenyl-d5 group, 4-methylphenyl group, 4-methoxyphenyl group, 4-ethylphenyl group, 4-fluorophenyl group, 4-trifluorophenyl group, 3,5-dimethylphenyl group, 2,6-diethylphenyl group, mesityl group, 4-tert-butylphenyl group, ditolylaminophenyl group, biphenyl group, terphenyl group, naphthyl group, naphthyl-d7 group, acenaphthylenyl group, anthryl group, anthryl-d9 group, phenanthryl group, phenanthryl-d9 group, pyrenyl group, pyrenyl-d9 group, acephenanthrylenyl group, aceanthrylenyl group, chrysenyl group, dibenzochrysenyl group, benzoanthryl group, benzoanthryl-d11 group, dibenzoanthryl group, naphthacenyl group, picenyl group, pentacenyl group, fluorenyl group, triphenylenyl group, perylenyl group, and perylenyl-d-11 group.

Examples of the substituted or unsubstituted heterocyclic group include, but are not limited to, pyrrolyl group, pyridyl group, pyridyl-d5 group, bipyridyl group, methylpyridyl group, pyrimidinyl group, pyrazinyl group, pyridazinyl group, terpyrrolyl group, thienyl group, thienyl-d4 group, terthienyl group, propylthienyl group, benzothienyl group, dibenzothienyl group, dibenzothienyl-d7 group, furyl group, furyl-d4 group, benzofuryl group, isobenzofuryl group, dibenzofuryl group, dibenzofuryl-d7 group, quinolyl group, quinolyl-d6 group, isoquinolyl group, quinoxalinyl group, naphthyridinyl group, quinazolinyl group, phenanthridinyl group, indolizinyl group, phenazinyl group, carbazolyl group, oxazolyl group, oxadiazolyl group, thiazolyl group, thiadiazolyl group, acridinyl group, and phenazinyl group.

Examples of the substituted or unsubstituted aralkylene group include, but are not limited to, benzylene group, 2-phenylethylene group, 2-phenylisopropylene group, 1-naphthylmethylene group, 2-naphthylmethylene group, 9-anthrylmethylene group, 2-fluorobenzylene group, 3-fluorobenzylene group, 4-fluorobenzylene group, 4-chlorobenzyl group, and 4-bromobenzylene group.

Examples of the substituted or unsubstituted alkenylene group include, but are not limited to, vinylene group, iso-propenylene group, styrylene group and 1,2-diphenylvinylene group.

Examples of the substituted or unsubstituted alkynylene group include, but are not limited to, acetylenylene group and a phenylacetylenylene group.

Examples of the substituted or unsubstituted arylene group include, but are not limited to, phenylene group, biphenylene group, tetrafluorophenylene group, dimethylphenylene group, naphthylene group, phenanthrylene group, pyrenylene group, tetracenylene group, pentacenylene group and perylenylene group.

Examples of the substituted or unsubstituted divalent heterocyclic group include, but are not limited to, furylene group, pyrrolylene group, pyridylene group, terpyridylene group, thienylene group, terthienylene group, oxazolylene group, thiazolylene group and carbazolylene group.

Examples of the substituted or unsubstituted amino group (—NR'R") include, but are not limited to, those wherein R' and R" are each independently a hydrogen atom, a deuterium atom, the above described substituted or unsubstituted alkyl, aralkyl, aryl, and heterocyclic groups, alkyl, alkenyl, alkynyl, aralkyl, or amino groups as linked by a substituted or unsubstituted arylene or divalent heterocyclic group, substituted silyl group, ether group, thioether group, or carbonyl group; for example, amino group, N-methylamino group, N-ethylamino group, N,N-dimethylamino group, N,N-diethylamino group, N-methyl-N-ethylamino group, N-benzylamino group, N-methyl-N-benzylamino group, N,N-dibenzylamino group, anilino group, N,N-diphenylamino group, N-phenyl-N-tolylamino group, N,N-ditolylamino group, N-methyl-N-phenylamino group, N,N-dianisolylamino group, N-mesityl-N-phenylamino group, N,N-dimesitylamino group, N-phenyl-N-(4-tert-butylphenyl)amino group, and N-phenyl-N-(4-trifluoromethylphenyl)amino group.

Examples of the substituted or unsubstituted alkoxy group include, but are not limited to, an alkyloxy group or aralkyloxy group which has the above described substituted or unsubstituted alkyl group or aralkyl group; an aryloxy group having the above described substituted or unsubstituted aryl group or heterocyclic group; for example, methoxy group, ethoxy group, propoxy group, 2-ethyl-octyloxy group, phenoxy group, 4-tert-butylphenoxy group, benzyloxy group, and thienyloxy group.

Examples of the substituted or unsubstituted sulfide group include, but are not limited to, an alkylsulfide group or aralkylsulfide group which has the above described substituted or unsubstituted alkyl group or aralkyl group; an arylsulfide group having the above described substituted or unsubstituted aryl group or heterocyclic group; for example, methyl sulfide group, ethylsulfide group, phenylsulfide group, and 4-methylphenylsulfide group.

The term "a group bonded through a linking group" herein employed refers to, for example, the "-Ph-O-Ph-" portion of Exemplified Compound No. 17 of the representative examples of the first compound as shown below, in which the ether group "—O—" is a linking group.

Examples of the linking group for bonding or joining of the above described substituents include, but are not limited to, the above described substituted or unsubstituted arylene, divalent heterocyclic, alkylene, alkenylene, alkynylene, and aralkylene groups; and substituted silyl group, ether group, thioether group, and carbonyl group.

Examples of the substituents which the above described substituents and linking groups may further posses include, but are not limited to, a deuterium atom; alkyl or aralkyl groups such as methyl group, ethyl group, n-propyl group, n-butyl group, n-pentyl group, n-hexyl group, n-heptyl group, n-octyl group, n-decyl group, iso-propyl group, iso-butyl group, sec-butyl group, tert-butyl group, iso-pentyl group, neopentyl group, tert-octyl group, benzyl group, and 2-phenylethyl group; alkoxy groups such as methoxy group, ethoxy group, propoxy group, 2-ethyl-octyloxy group, phenoxy group, 4-tert-butylphenoxy group, and benzyloxy group; aryl groups such as phenyl group, 4-methylphenyl group, 4-ethylphenyl group, 3-chlorophenyl group, 3,5-dimethylphenyl group, triphenylamino group, biphenyl group, terphenyl group, naphthyl group, anthryl group, phenanthryl group, and pyrenyl group; heterocyclic groups such as pyridyl group, bipyridyl group, methylpyridyl group, thienyl group, terthienyl group, propylthienyl group, furyl group, quinolyl group, carbazolyl group, and N-ethylcarbazolyl group; a halogen group, a hydroxyl group, a cyano group, and a nitro group.

The first compound of the present invention is preferably a compound wherein $Z_1$ is a direct single bond and m is 1, specifically, a compound represented by the following general formula (2); and is more preferably a compound wherein $X_2$ in the general formula (2) is a direct single bond, specifically, a compound represented by the following general formula (3).

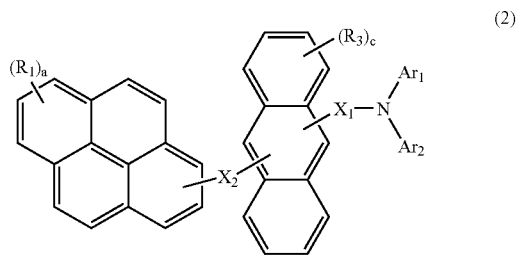

(2)

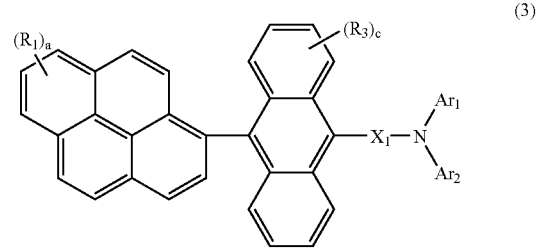

(3)

In addition, the first compound is also preferably a compound wherein $Z_1$ is phenylene group, specifically, a compound represented by the following general formula (4); and is more preferably a compound wherein $Z_1$ in the general formula (4) is metaphenylene group, b is 1 and m is 1, specifically, a compound represented by the following general formula (5).

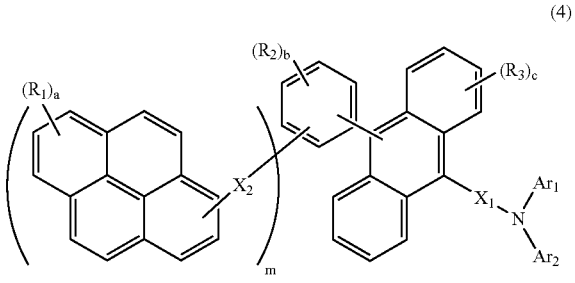

(4)

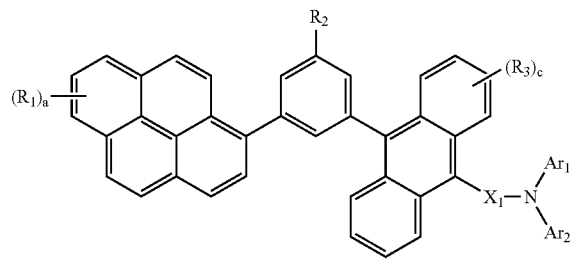

(5)

Next, representative examples of the first compound used in the present invention will be shown, but the compound is not limited to the examples.

9
10
1
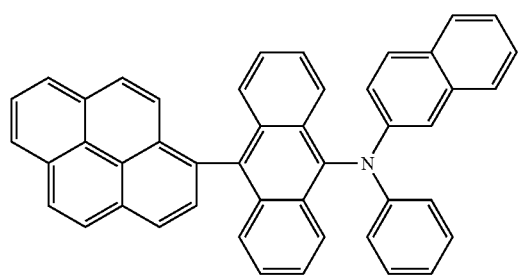
2
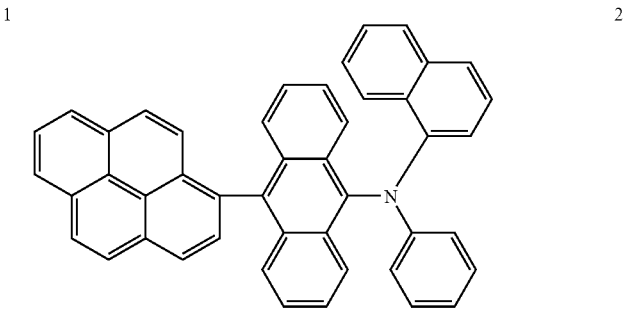
3
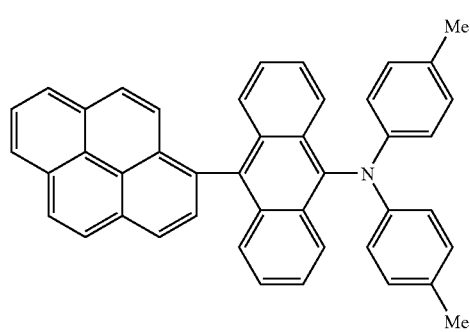
4
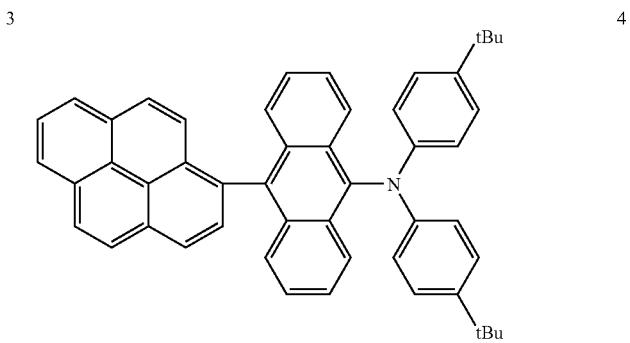
5
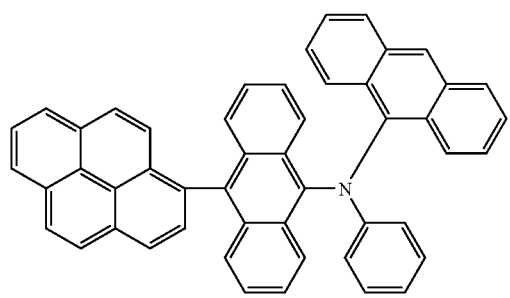
6
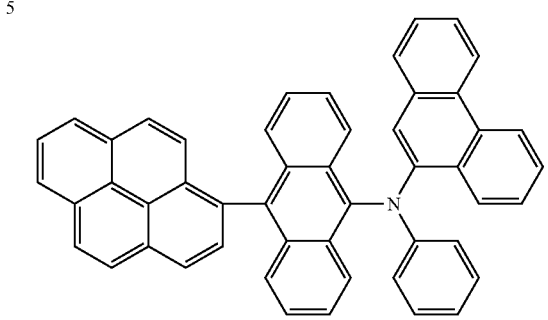
7
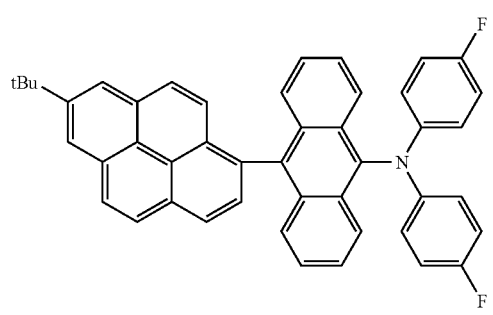
8
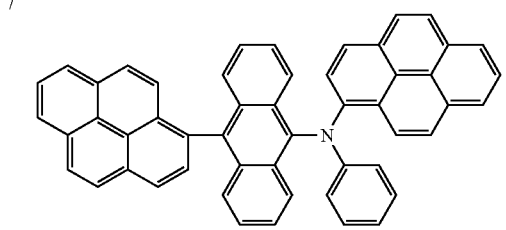
9
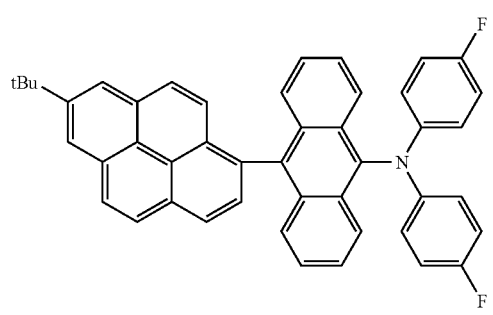
10
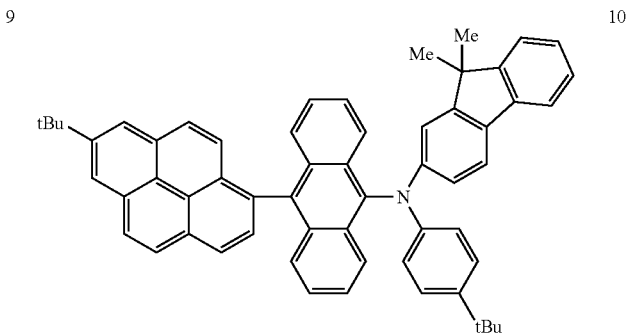

-continued
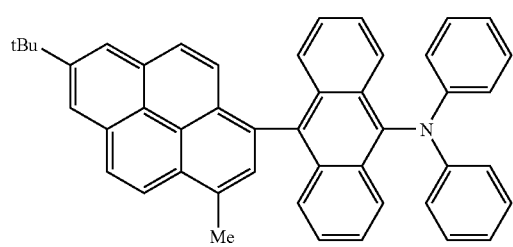
11
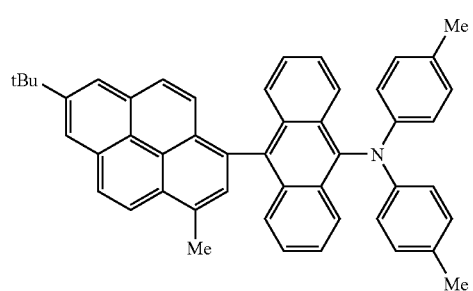
12
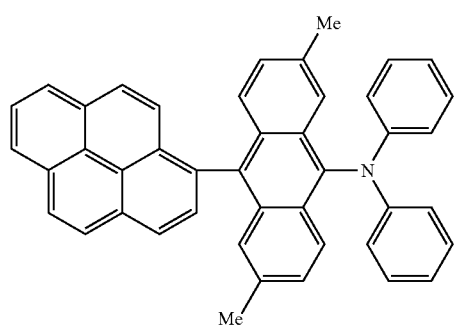
13
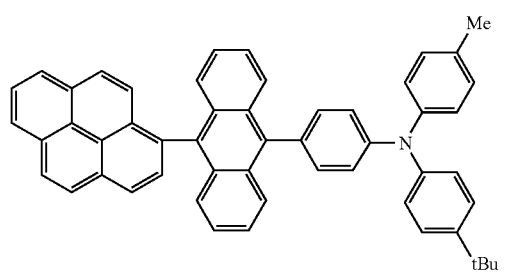
14
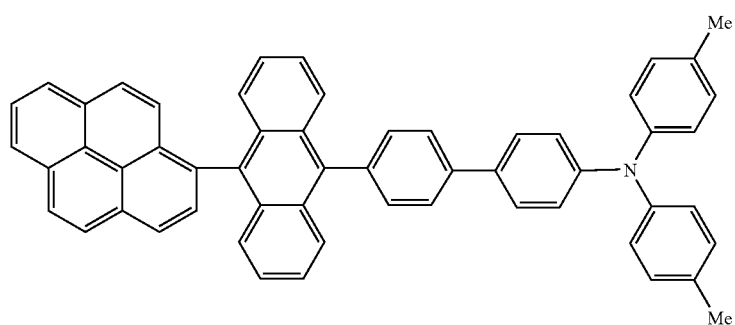
15
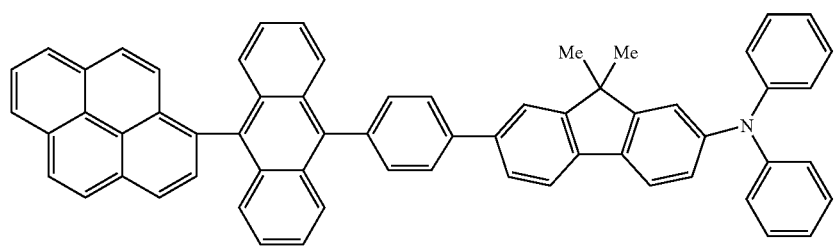
16
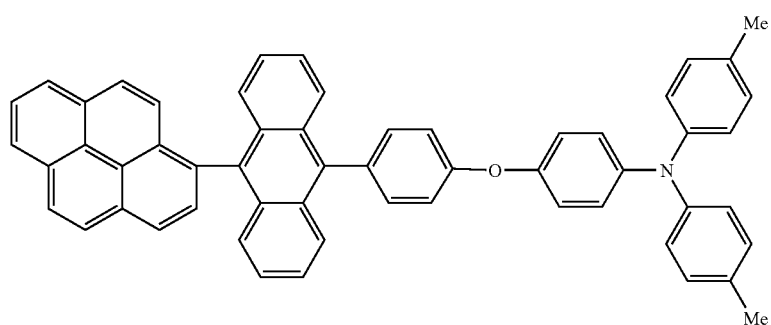
17

-continued
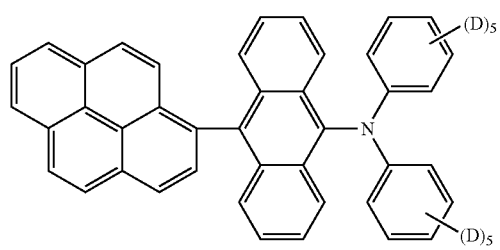
18
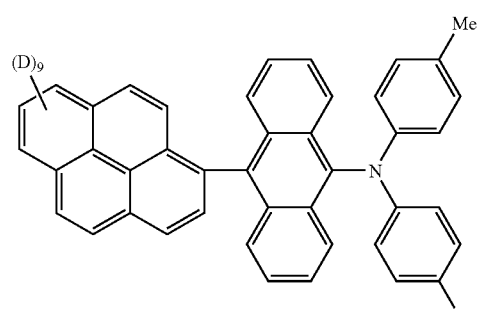
19
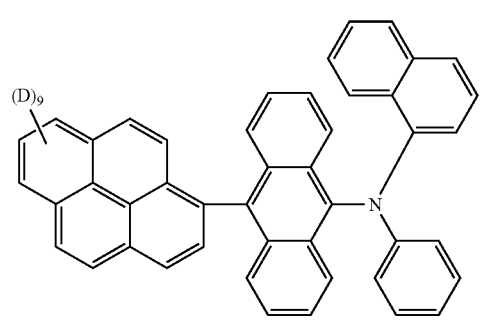
20
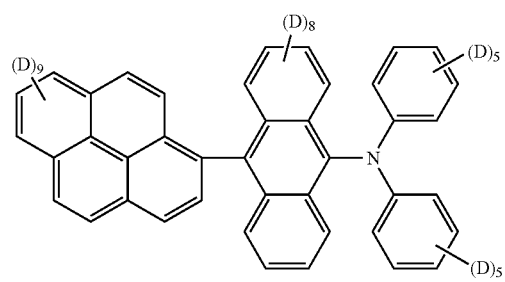
22
21
23
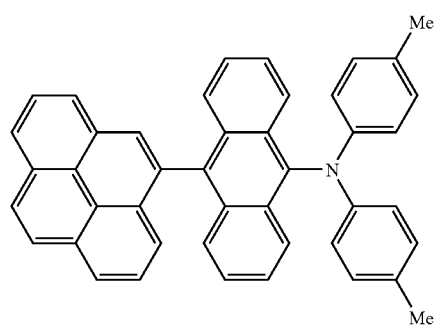
24
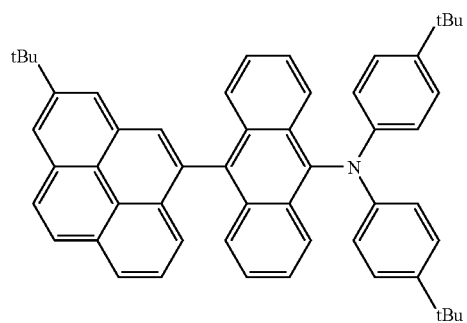
26
25
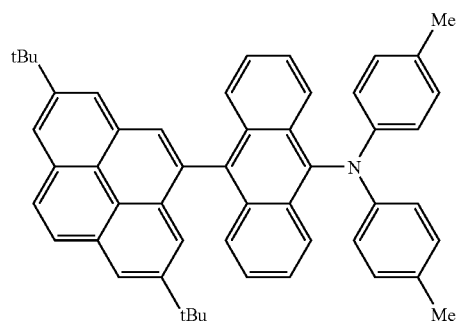
27

-continued
28
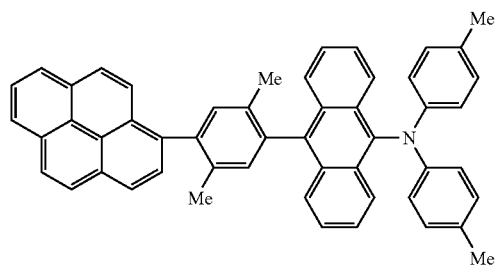
29
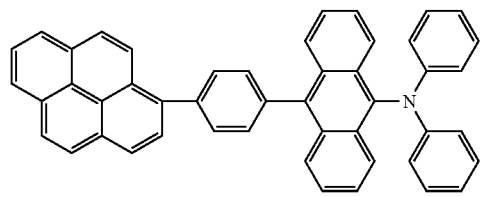
30
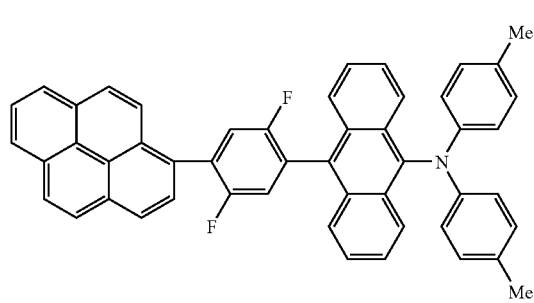
31
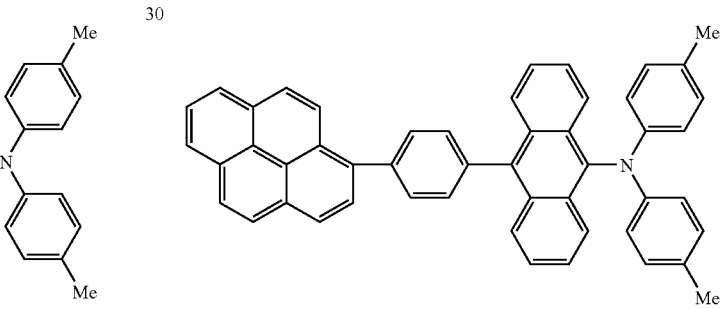
32
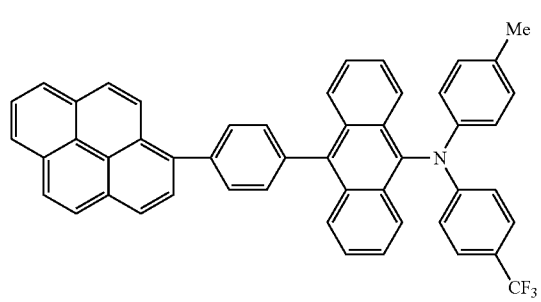
33
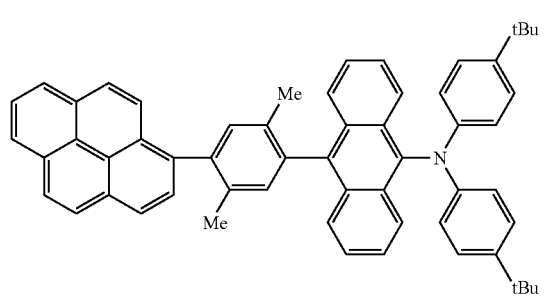
34
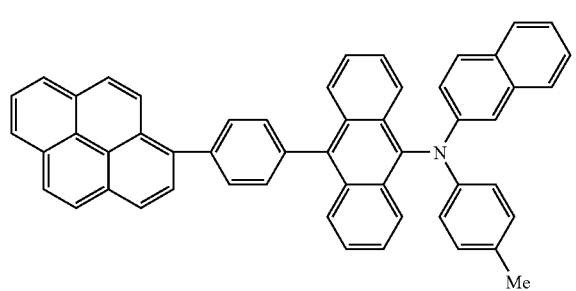
35
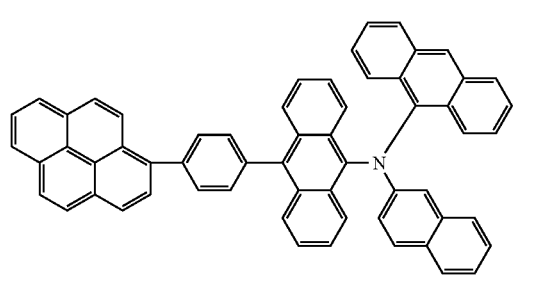
36
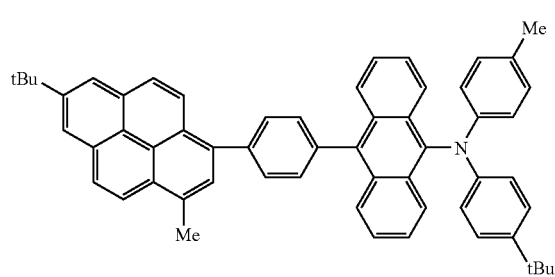
37
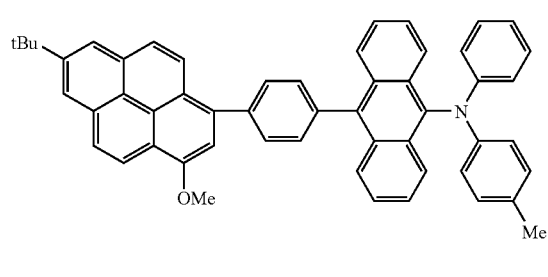

-continued
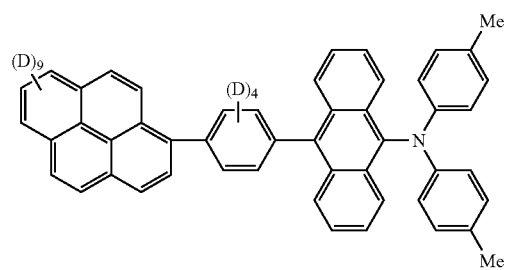
38
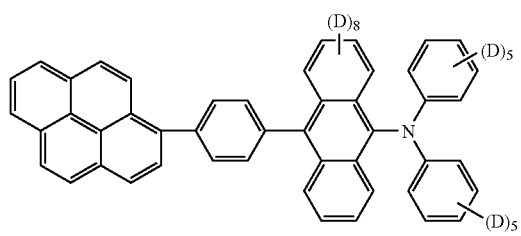
39
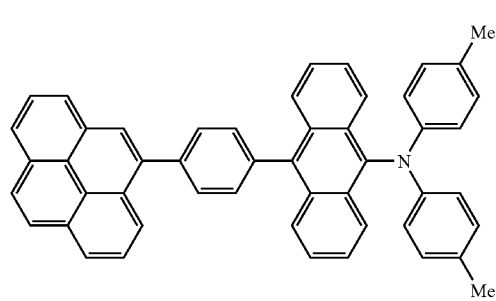
40
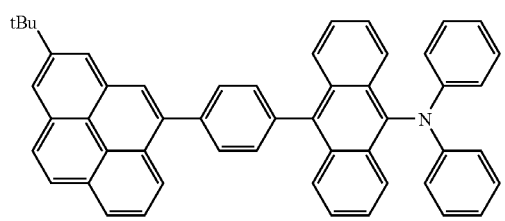
41
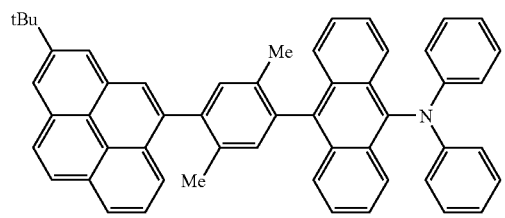
42
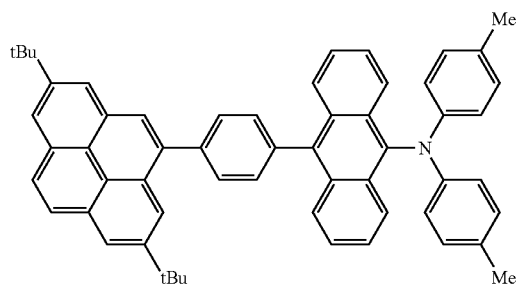
43
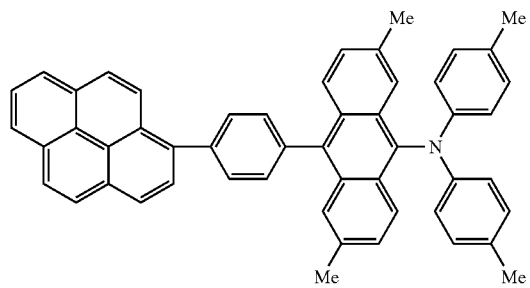
44
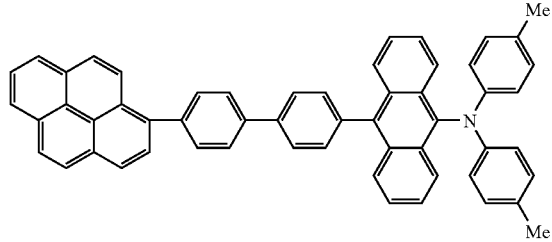
45
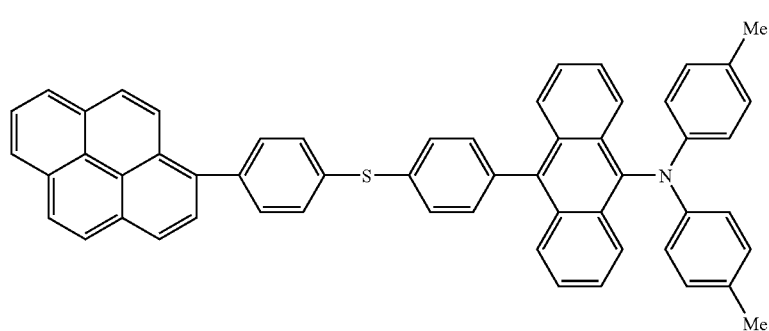
46

-continued
47
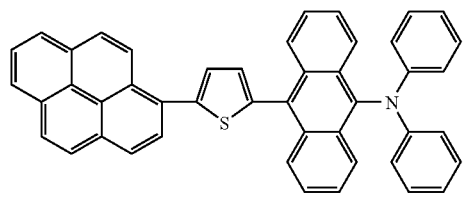
48
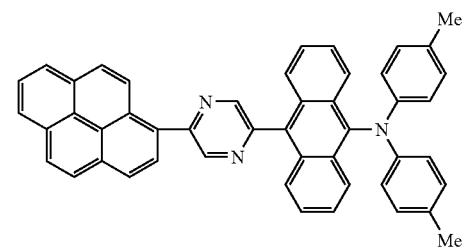
49
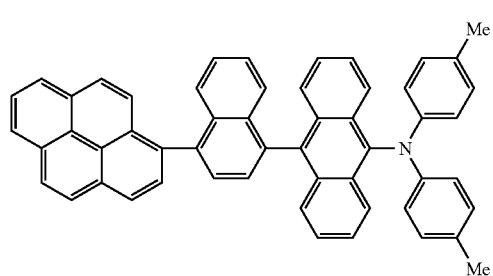
50
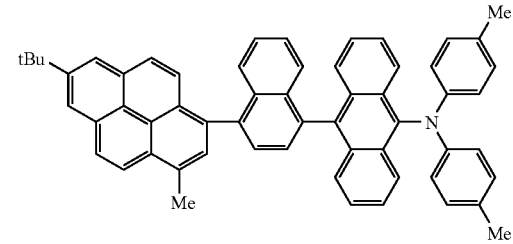
51
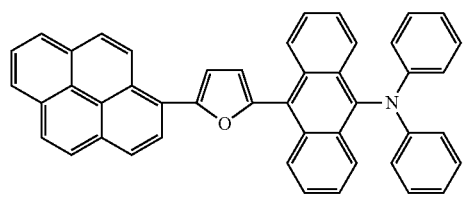
52
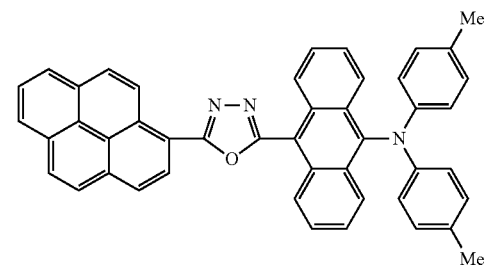
53
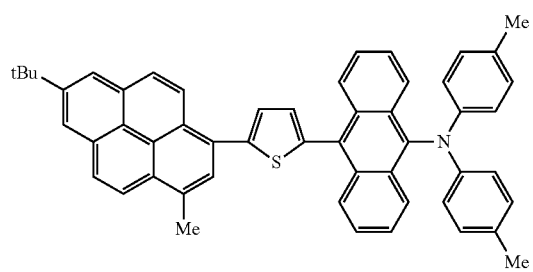
54
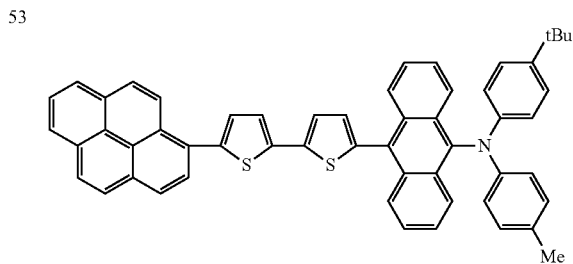
55
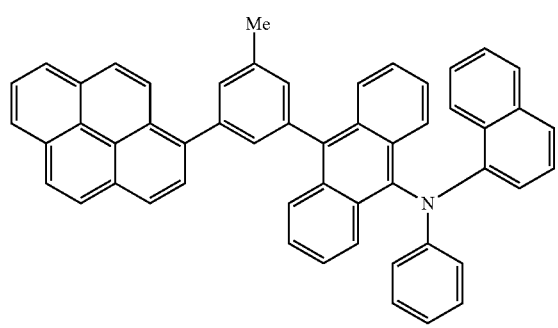
56
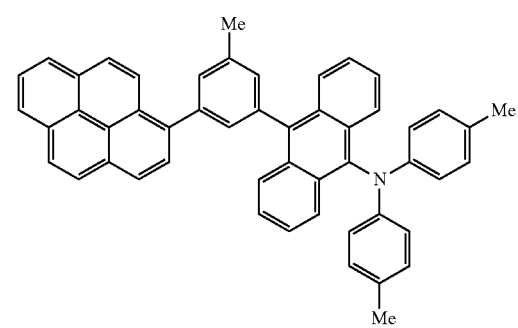

-continued
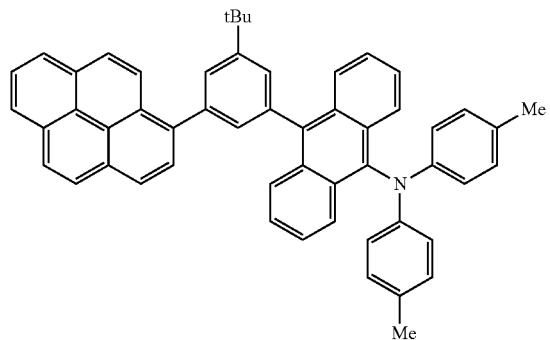
57
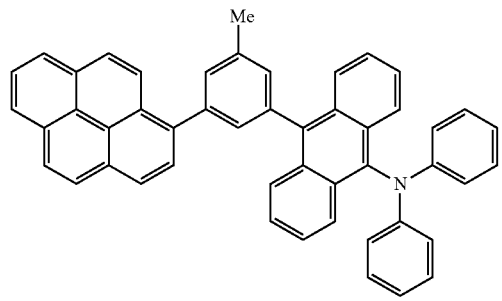
58
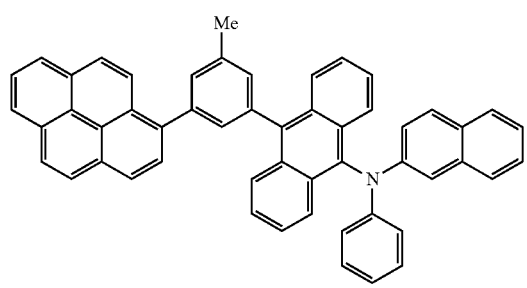
59
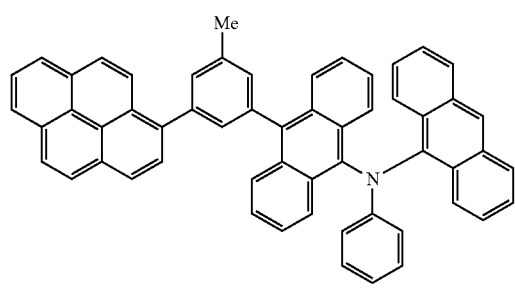
60
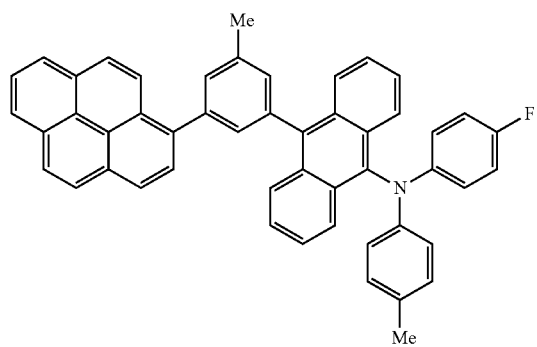
61
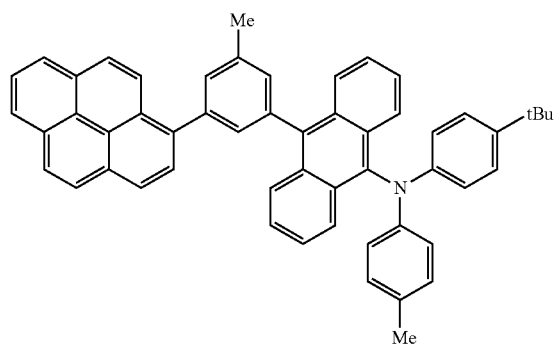
62
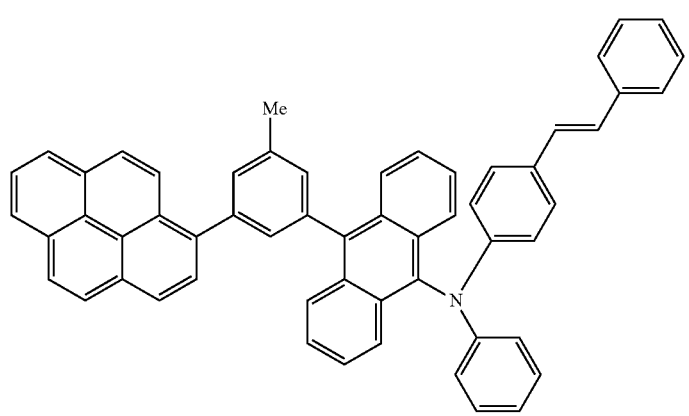
63

-continued
64
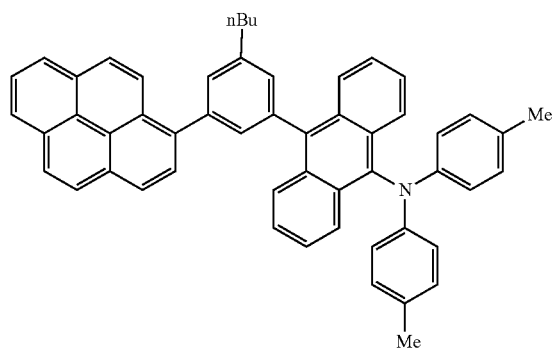
65
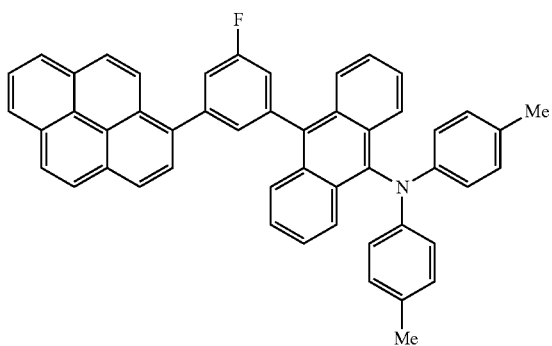
66
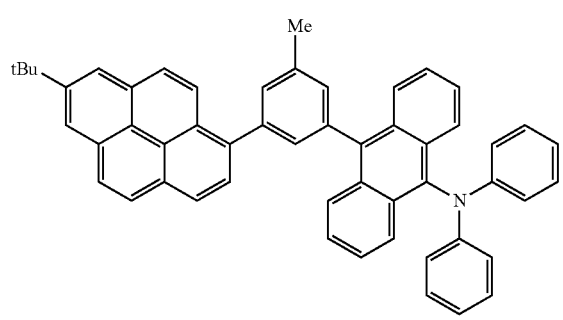
67
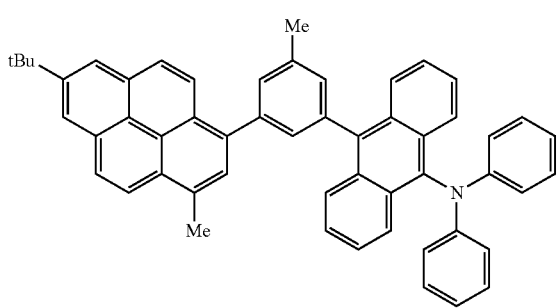
68
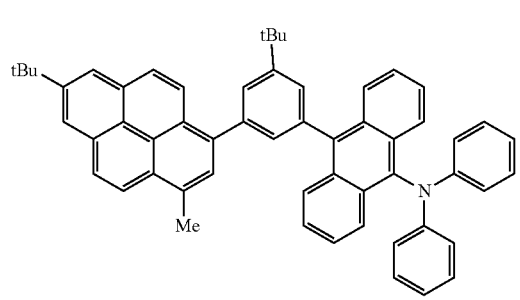
69
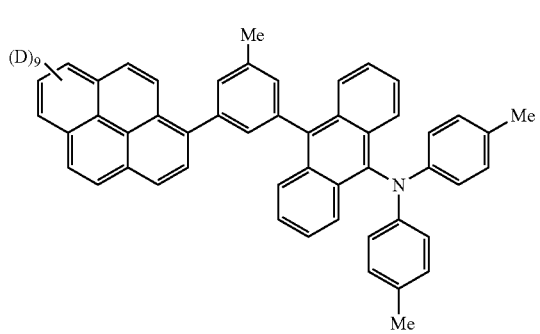
70
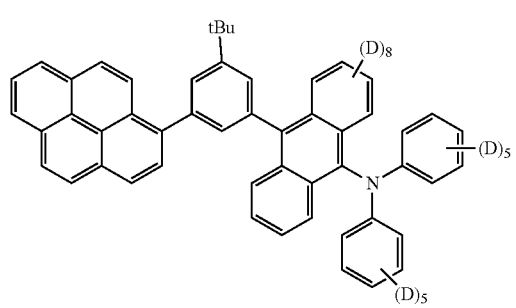
71
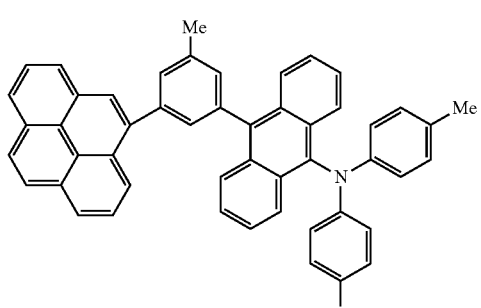
72
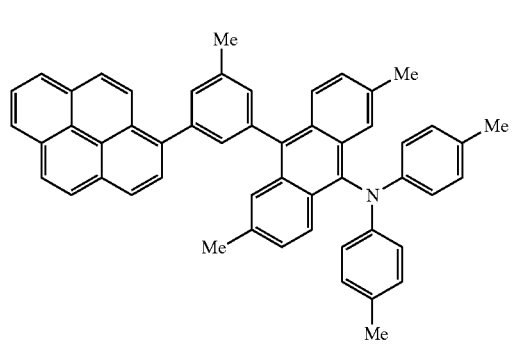
73
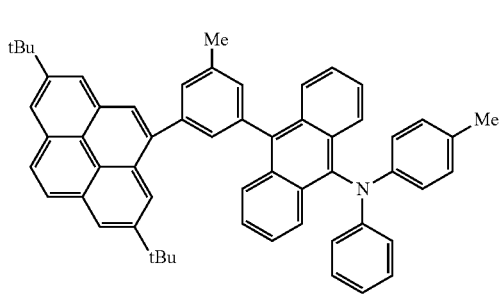

-continued
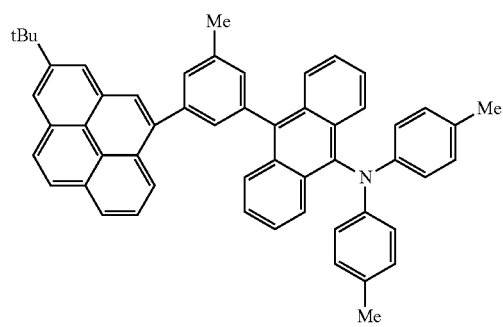
74
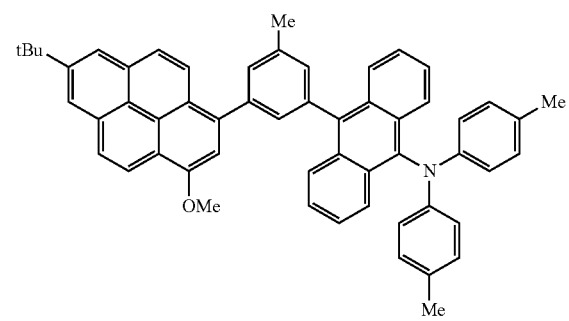
75
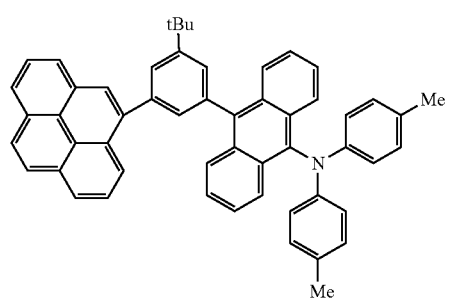
76
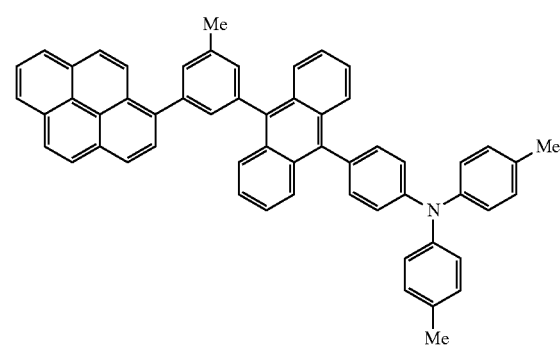
77
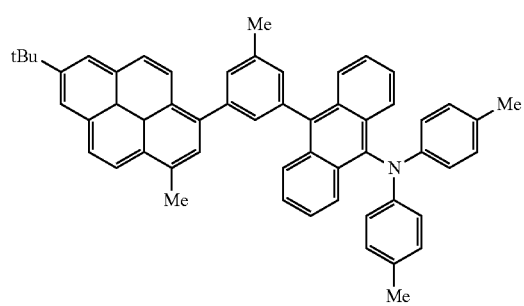
78
79
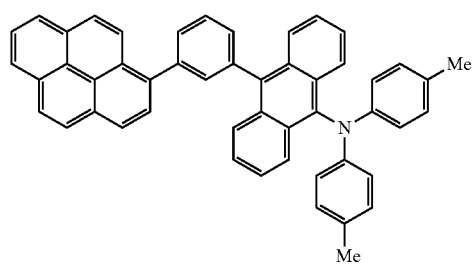
80
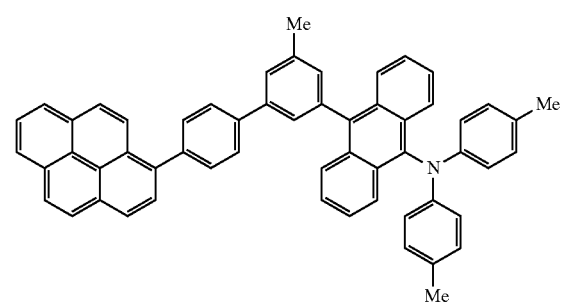
81
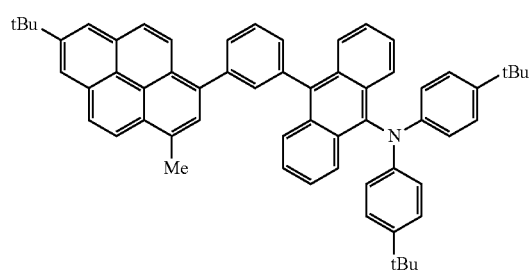
82
83

84
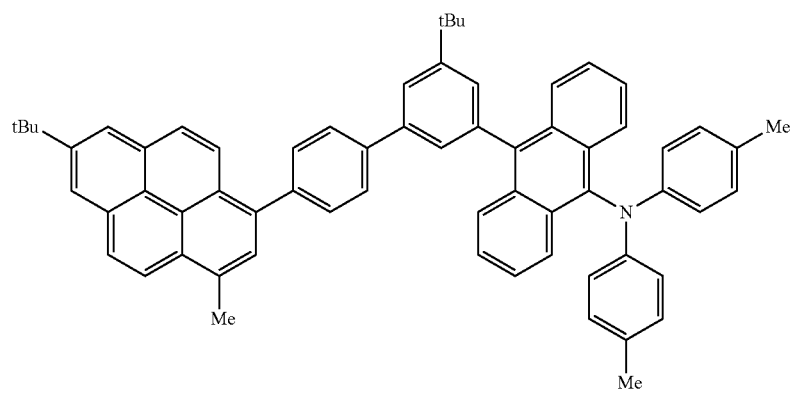
85
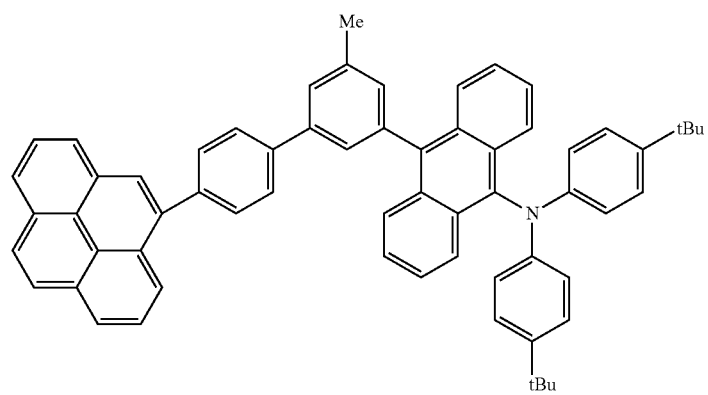
87
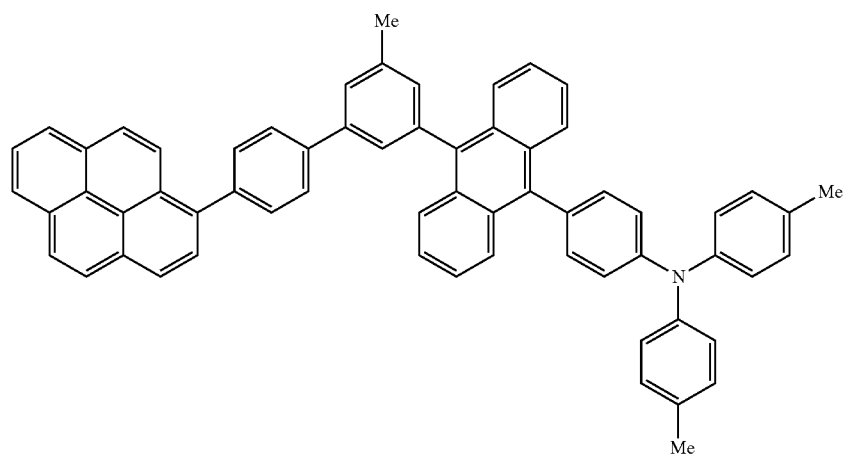

88
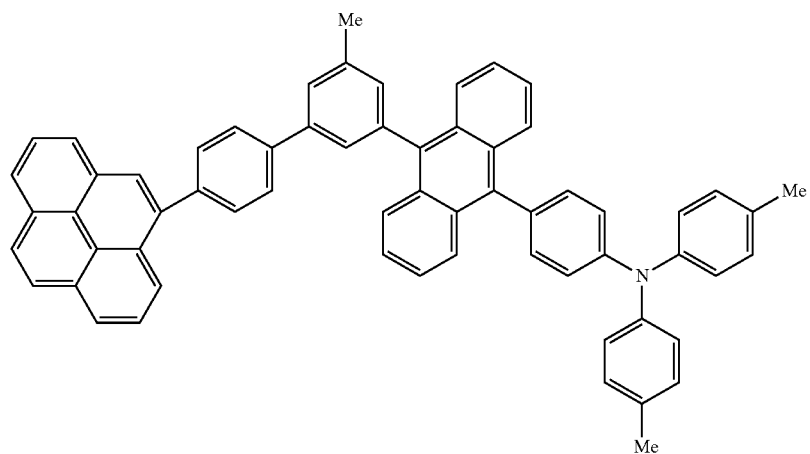
89
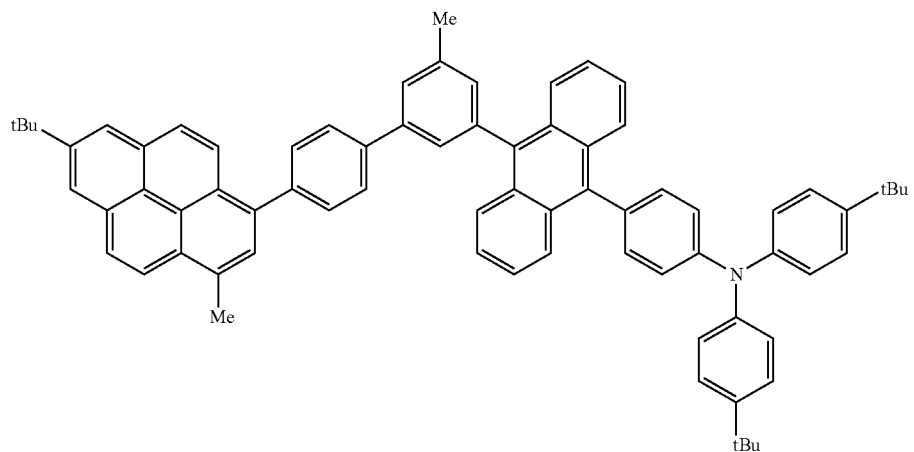
90
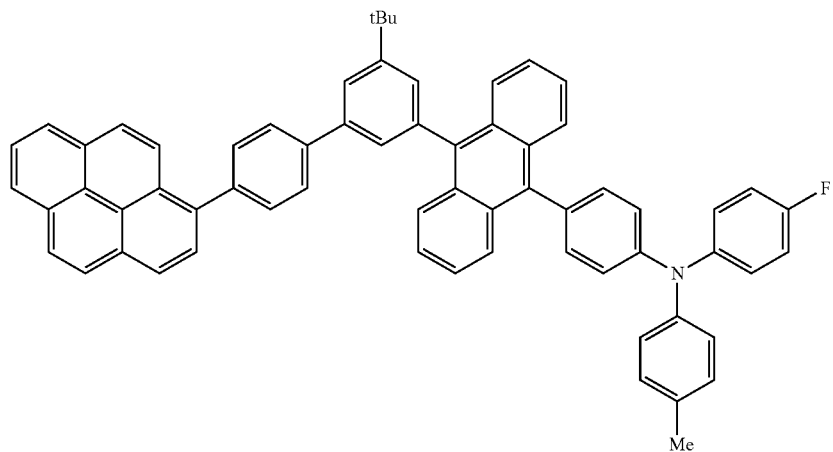

The second compound preferably has a structure represented by the following general formula (6):

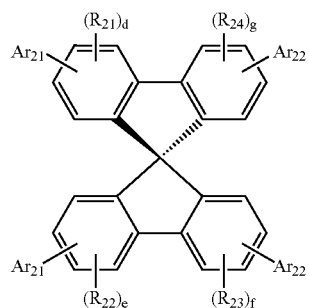
(6)

wherein each $R_{21}$, each $R_{22}$, each $R_{23}$, and each $R_{24}$ is independently a hydrogen atom, an alkyl group, a substituted or unsubstituted aralkyl group, a substituted or unsubstituted aryl group, a substituted or unsubstituted heterocyclic group, a substituted amino group, cyano group, and a halogen atom;
each $Ar_{21}$ and each $Ar_{22}$ is independently a substituted or unsubstituted condensed (or fused) polycyclic aromatic group, or a substituted or unsubstituted condensed polycyclic heterocyclic group; and
d, e, f, and g are each an integer of 1 to 3,
and the following general formula (7):

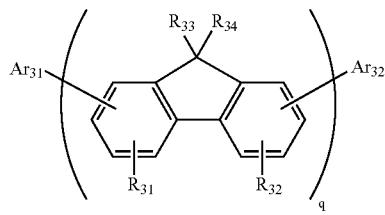
(7)

wherein each $R_{31}$ and each $R_{32}$ is independently a hydrogen atom, an alkyl group, a substituted or unsubstituted aralkyl group, a substituted or unsubstituted aryl group, a substituted or unsubstituted heterocyclic group, a substituted amino group, cyano group, or a halogen atom;

each $R_{33}$ and each $R_{34}$ is independently a hydrogen atom, an alkyl group, a substituted or unsubstituted aralkyl group, a substituted or unsubstituted aryl group, or a substituted or unsubstituted heterocyclic group;

$Ar_{31}$ and $Ar_{32}$ are each independently a substituted or unsubstituted condensed polycyclic aromatic group with three or more benzene rings, or a substituted or unsubstituted condensed polycyclic heterocyclic group with three or more benzene rings; and q is an integer of 1 to 10.

The compounds each have a rigid and bulky unit as a central portion, and further have a condensed polycyclic aromatic group or condensed polycyclic heterocyclic group, which is excellent in carrier-transporting property and emission characteristics; are less likely to crystallize; are excellent in stability over time; and enable the device to effect highly efficient light emission.

Representative examples of the compound represented by the general formula (6) are shown below.

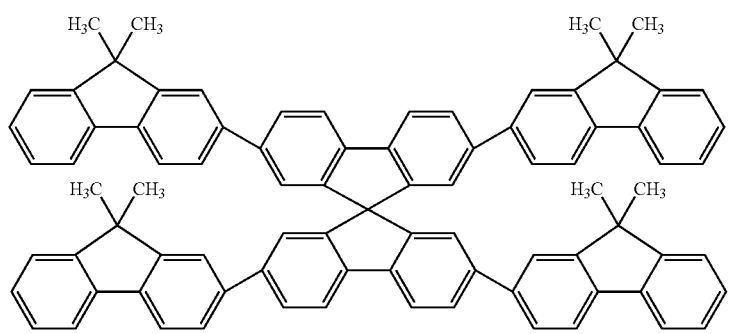
101

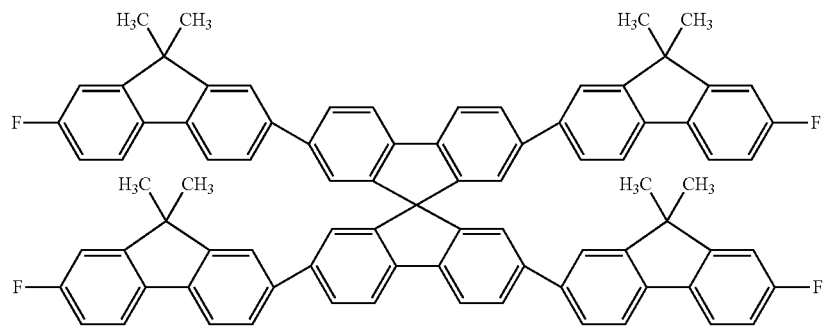
102
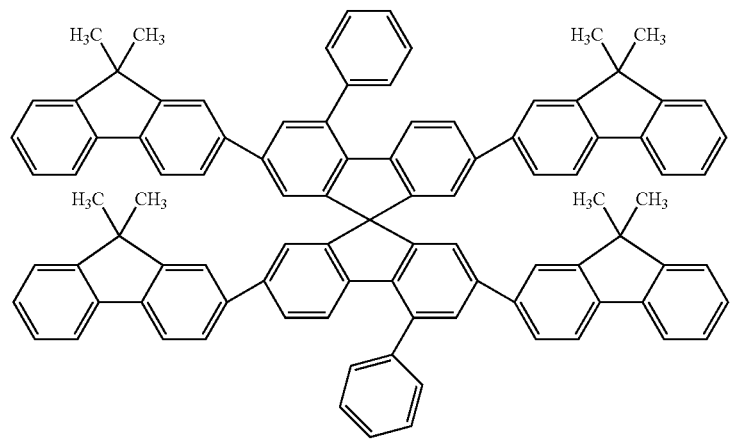
103
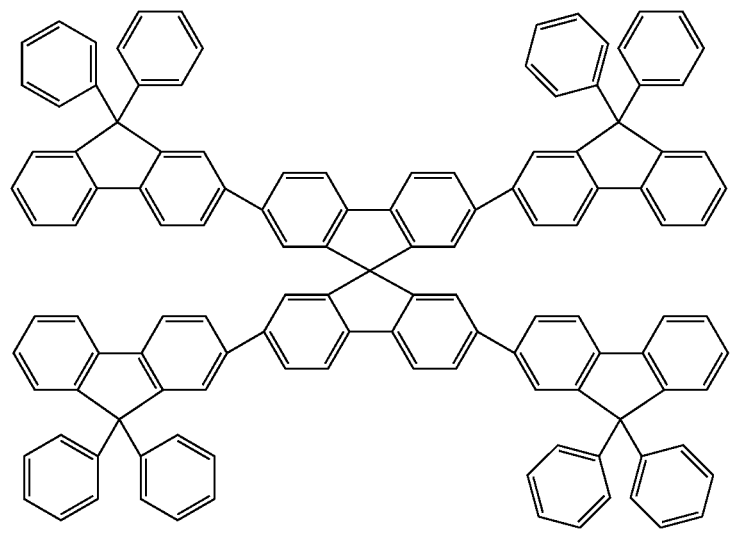
104
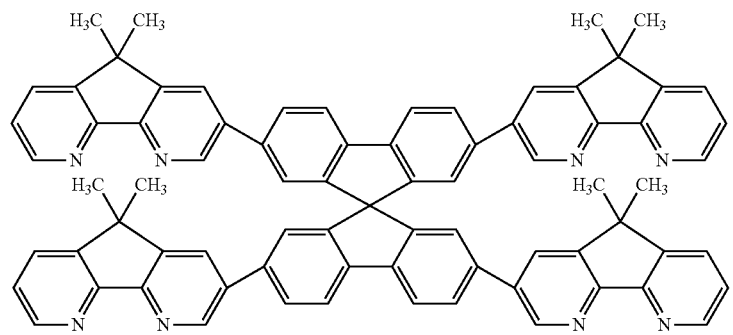
105

-continued
106
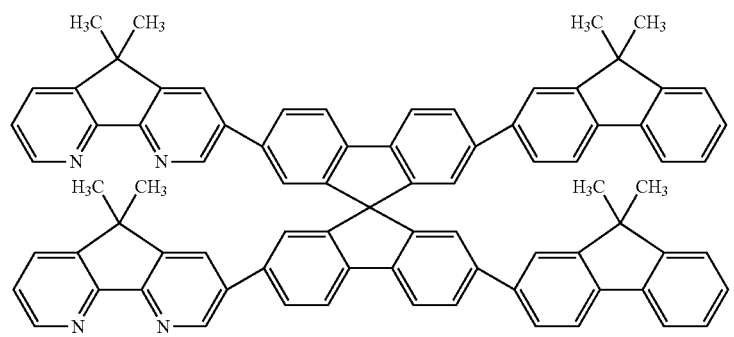
107
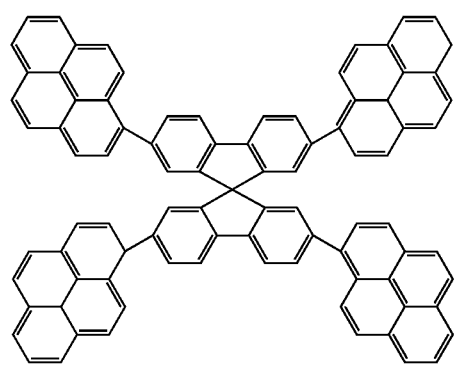
108
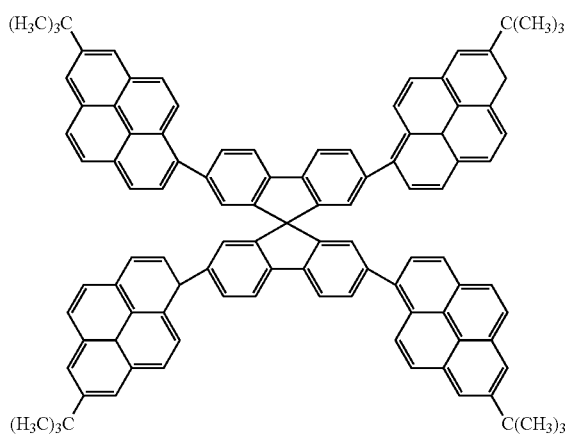
109
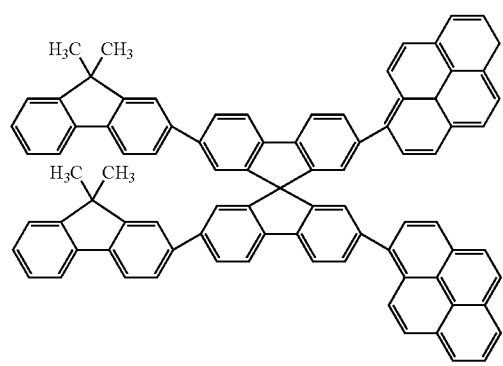
110
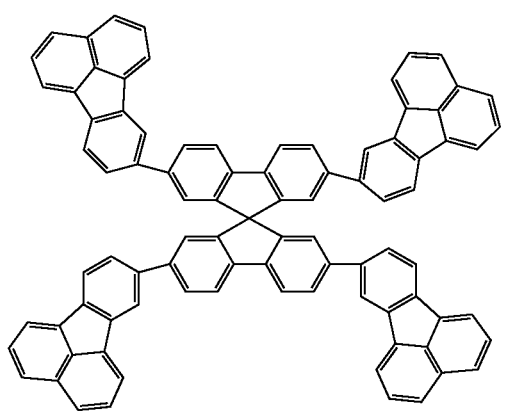
111
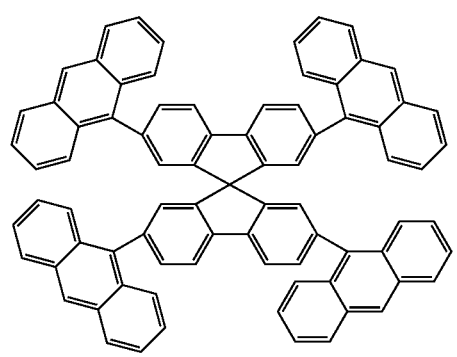
112
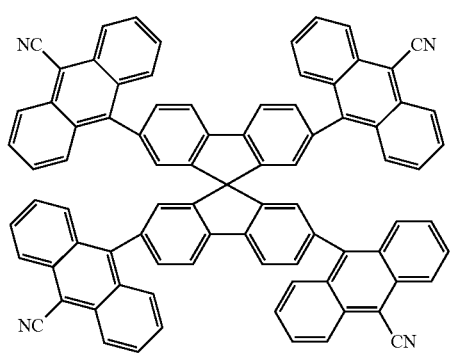

-continued
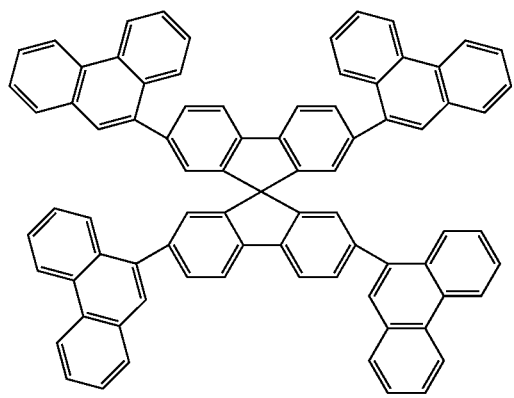
113
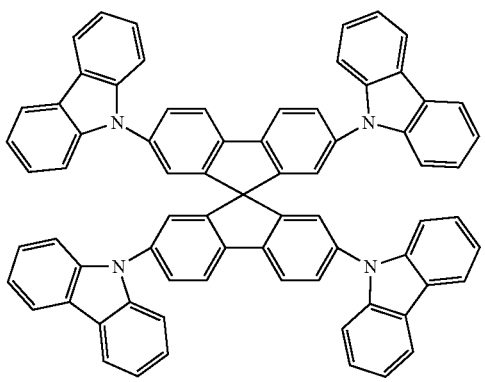
114
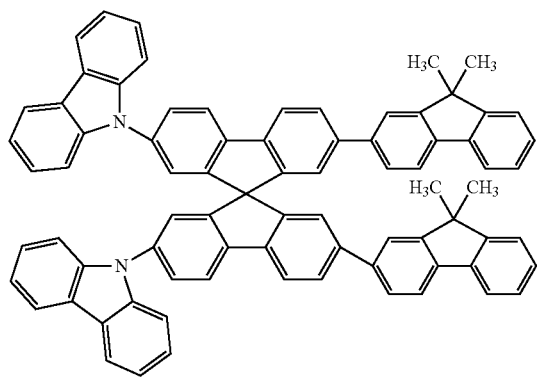
115
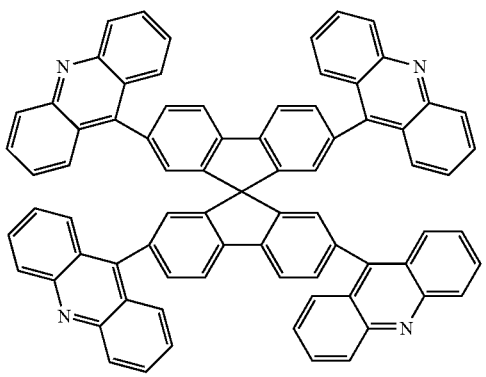
116
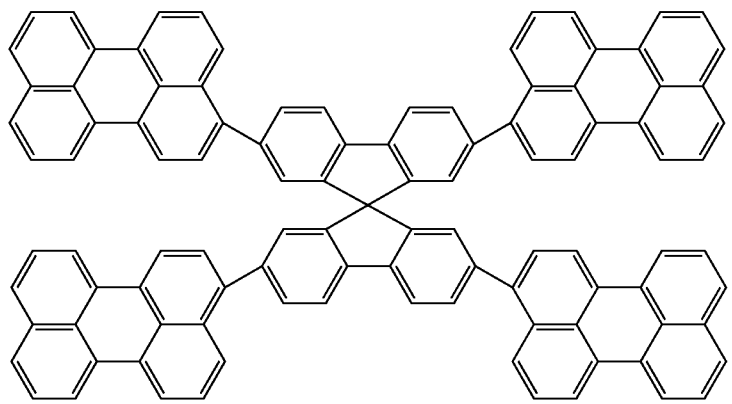
117

-continued
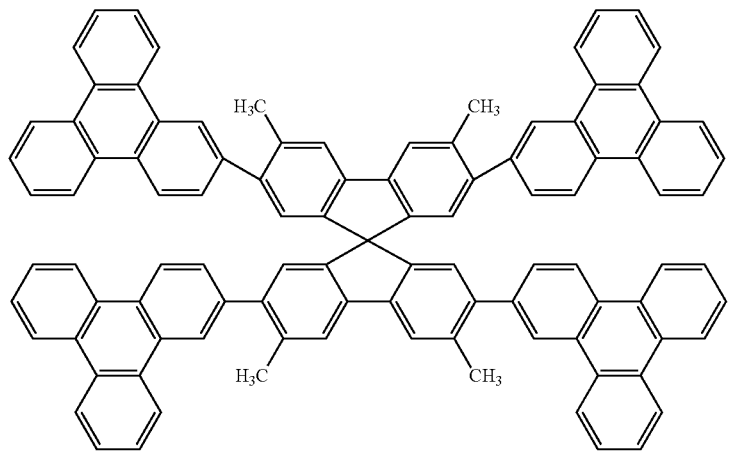
118
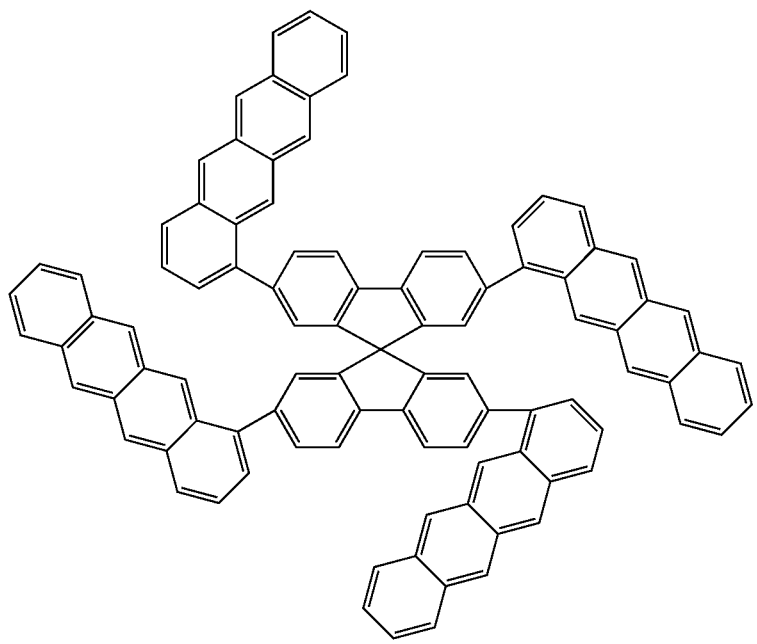
119
Representative examples of the compound represented by the general formula (7) are shown below.
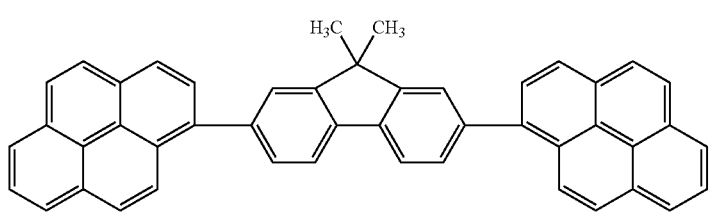
201
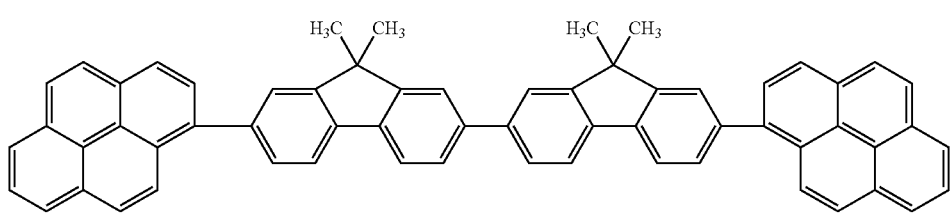
202

-continued
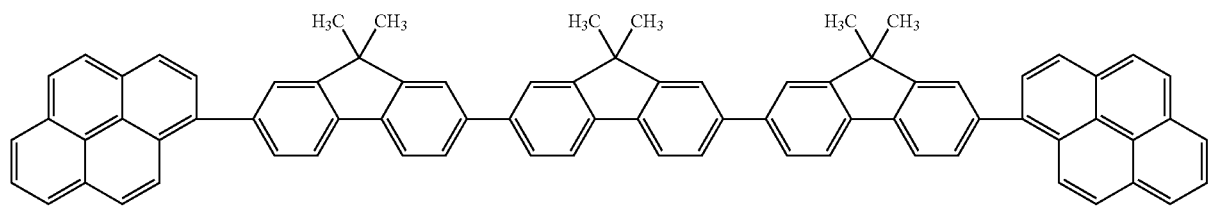
203
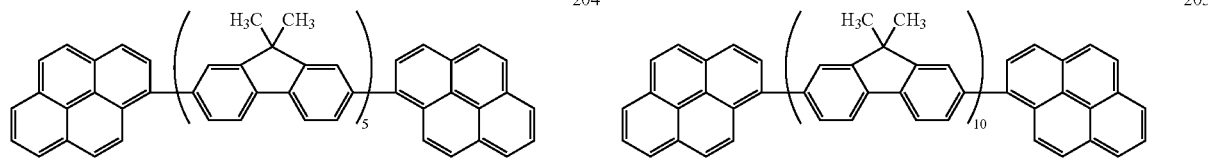
204
205
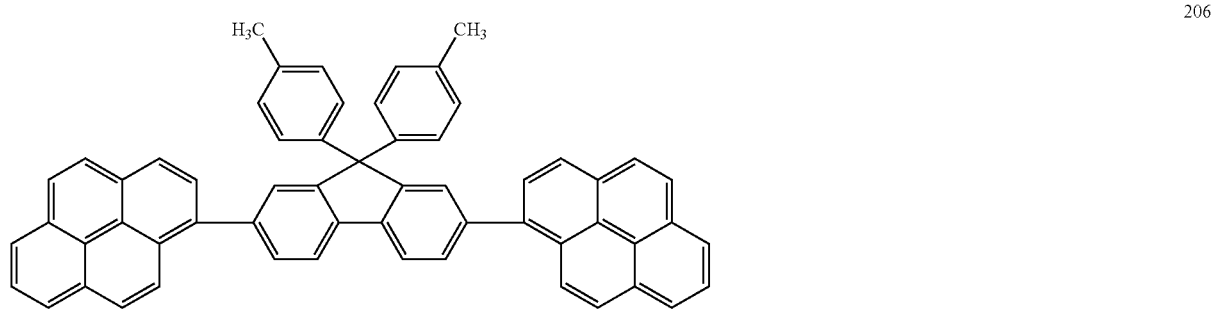
206
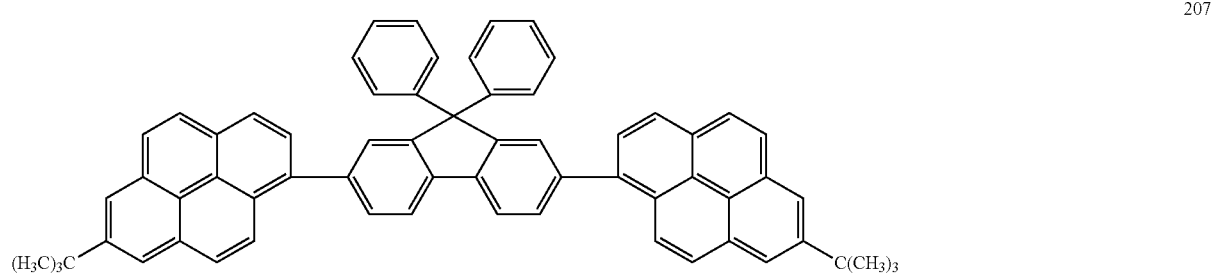
207
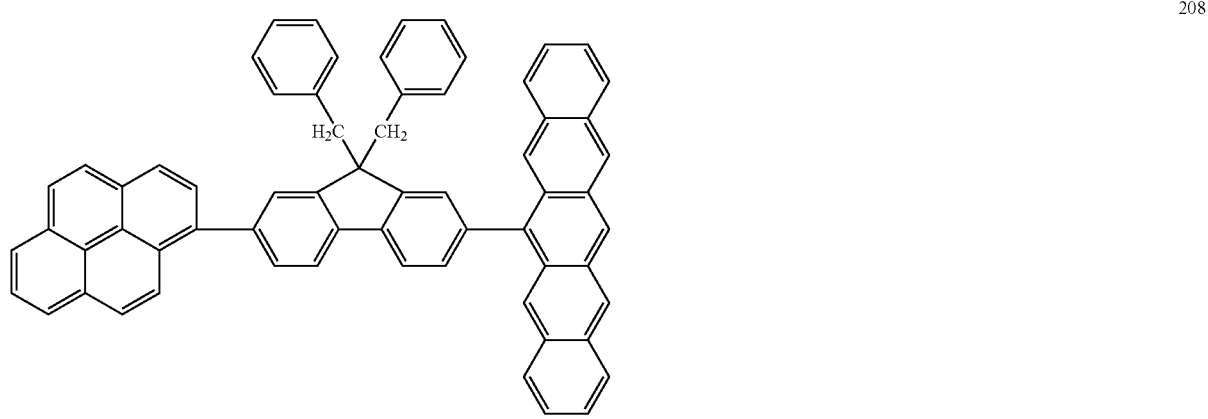
208
209
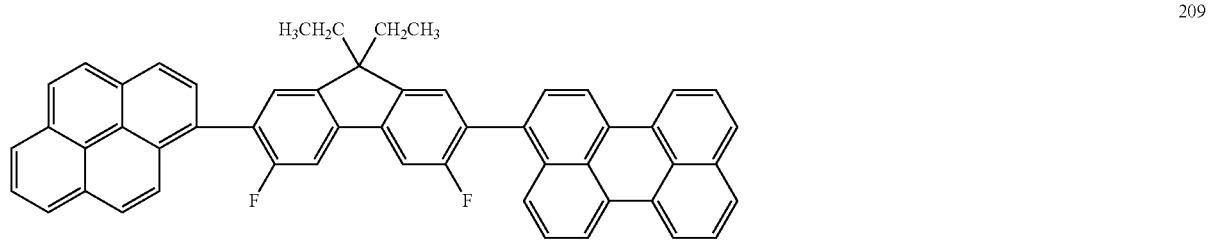

-continued
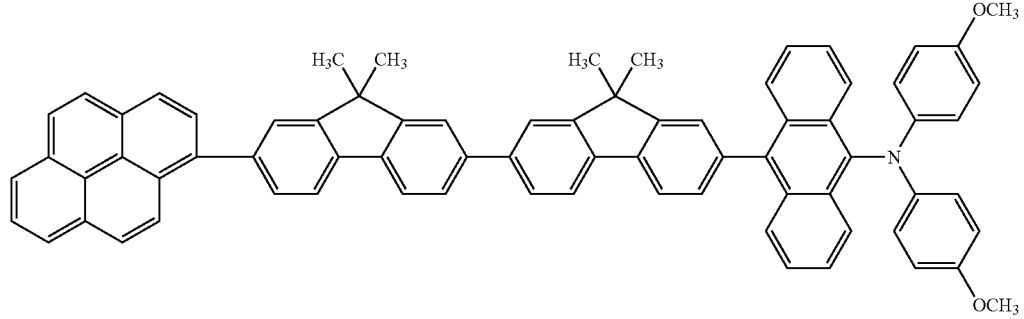
210
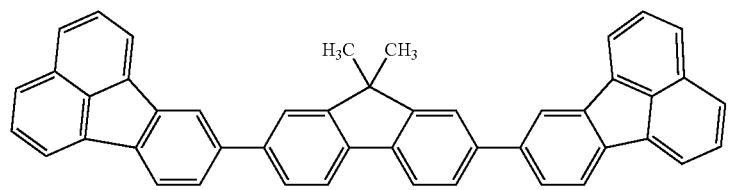
211
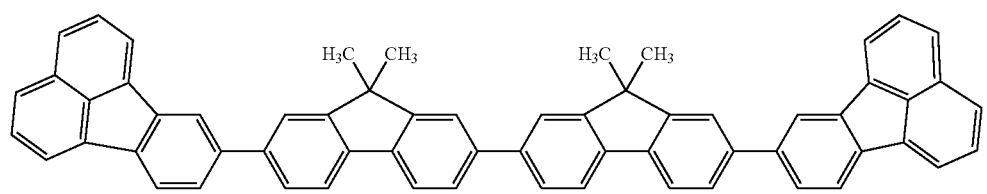
212
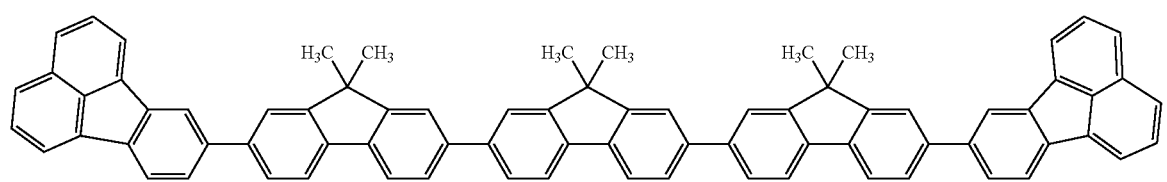
213
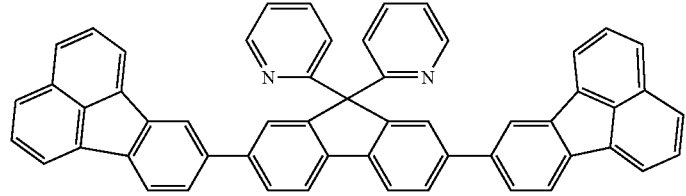
214
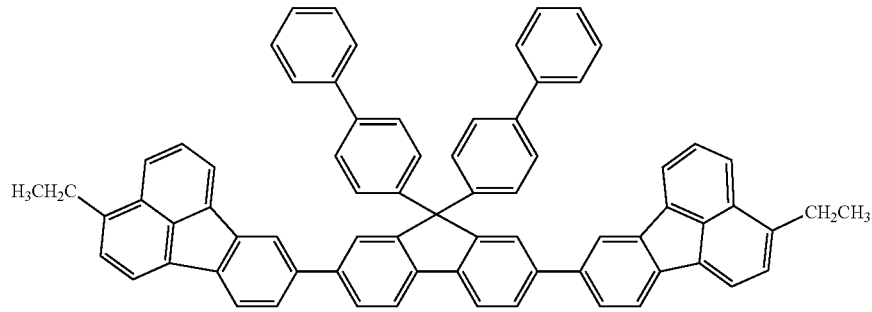
215

-continued
216
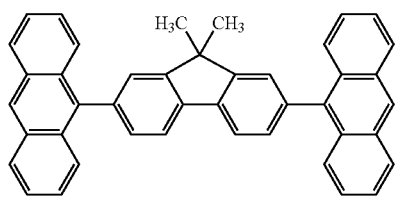
217
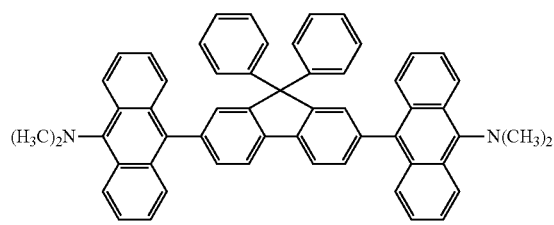
218
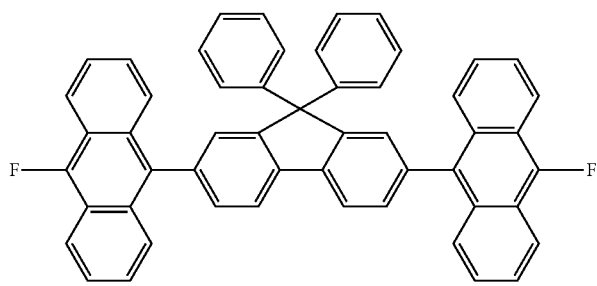
219
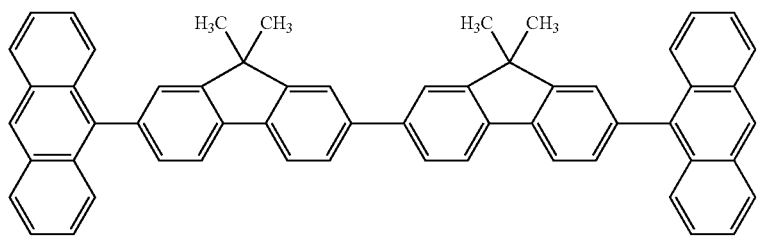
220
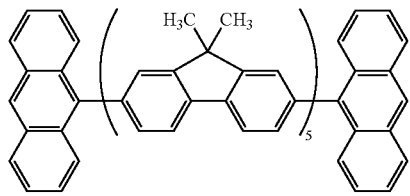
221
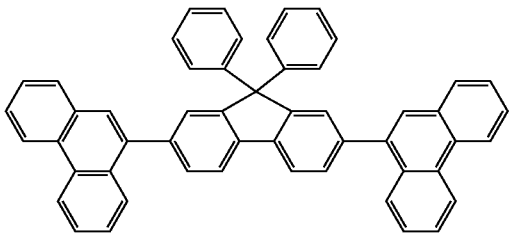
222
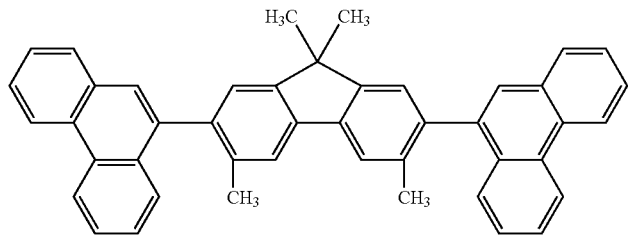
223
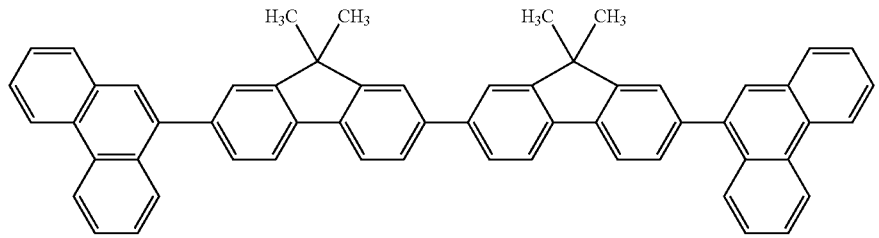

-continued
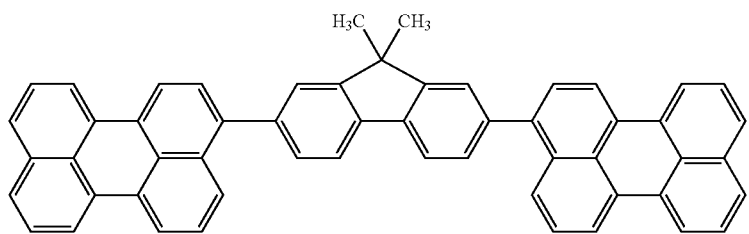
224
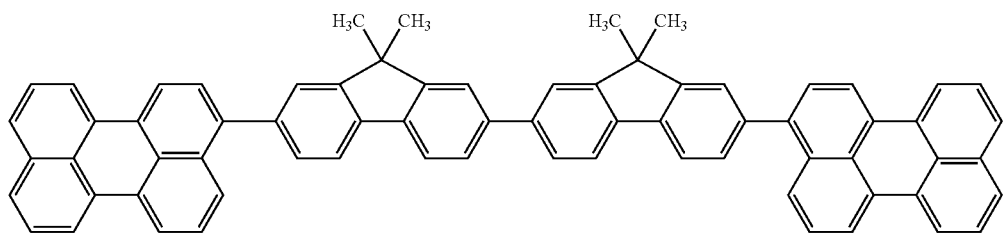
225
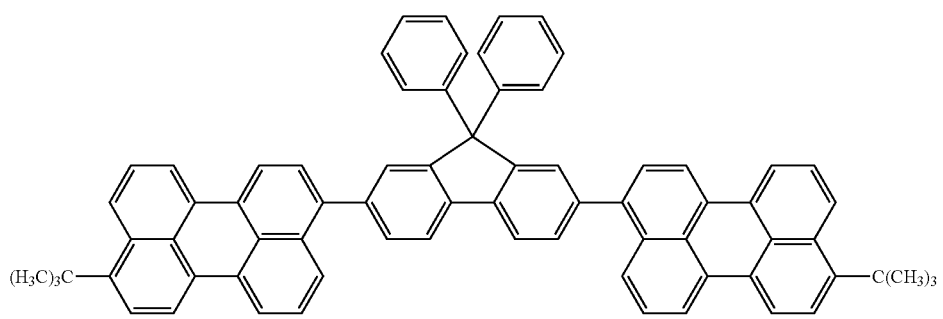
226
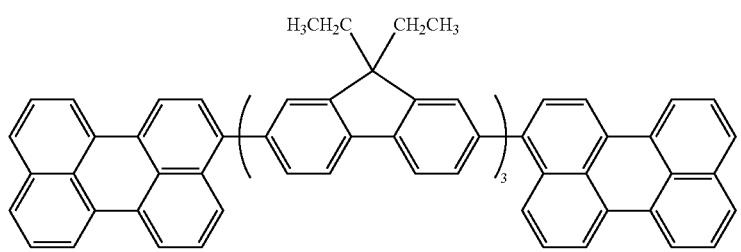
227
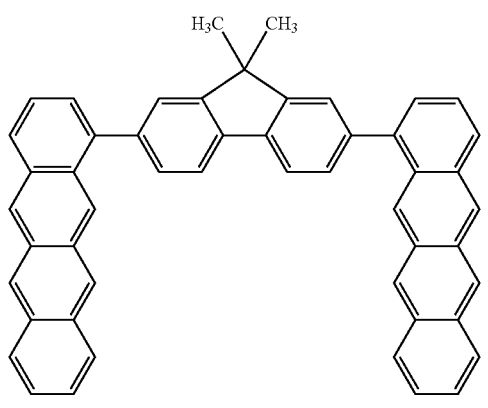
228
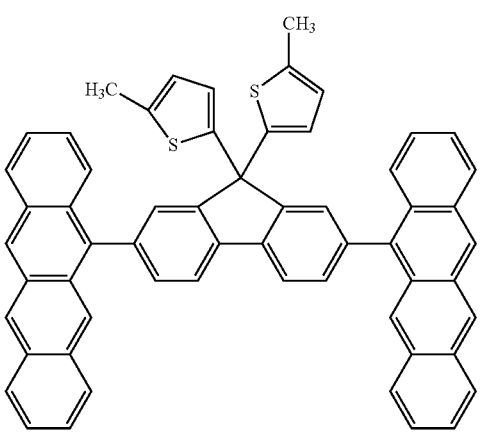
229

-continued
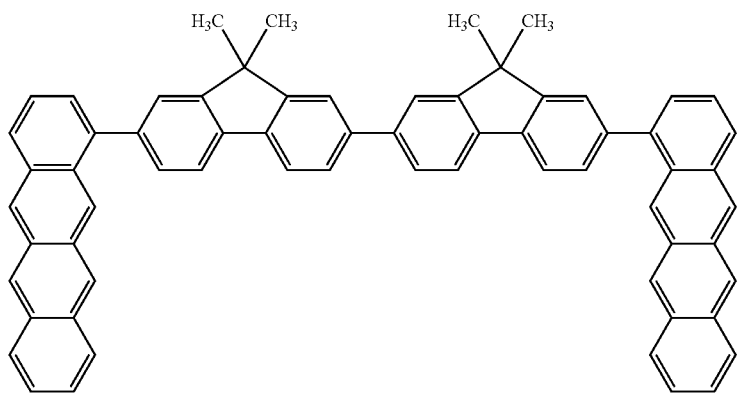
230
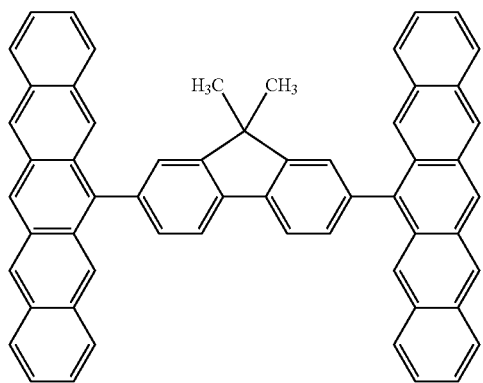
231
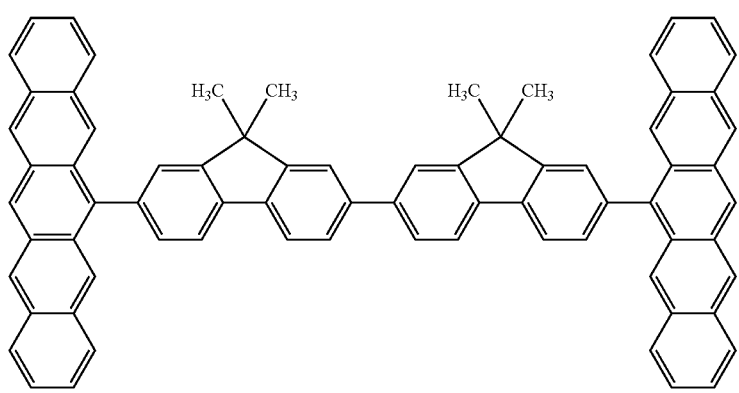
232
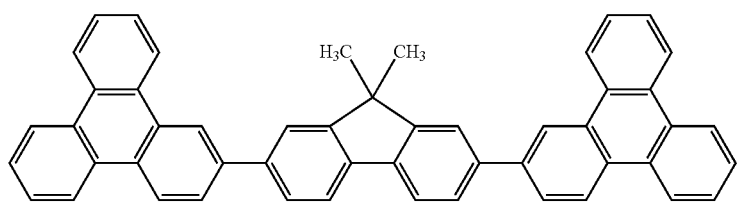
233

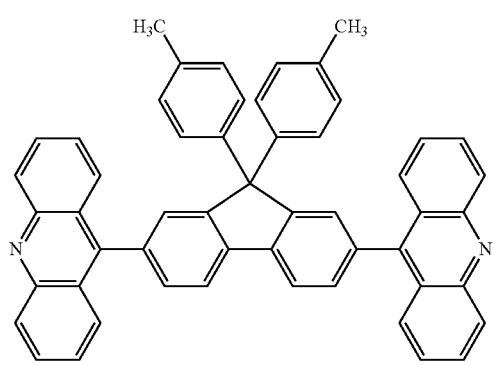

234

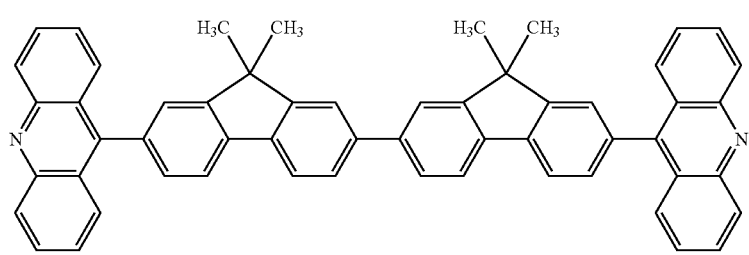

235

The present invention is characterized by an organic layer in a light-emitting region, and other organic layers (hole-injecting layer, hole-transporting layer, electron-transporting layer, and the like) can be formed by employ hitherto known materials, as needed.

Examples of such compounds will be now described below.

It is preferable that the hole injecting/transporting material facilitates injection of holes from an anode and has an excellent mobility for transporting the injected holes to a light-emitting layer. Examples of low molecular and high molecular materials having the hole injecting/transporting capability include a triarylamine derivative, a phenylenediamine derivative, a triazole derivative, an oxadiazole derivative, an imidazole derivative, a pyrazoline derivative, a pyrazolone derivative, an oxazole derivative, a fluorenone derivative, a hydrazone derivative, a stilbene derivative, a phthalocyanine derivative, a porphyrin derivative, poly(vinylcarbazole), poly(silylene), poly(thiophen) and other conductive polymers, but is not limited to them. Representative examples thereof will be shown below.

<Low Molecular Hole Injecting/Transporting Materials>

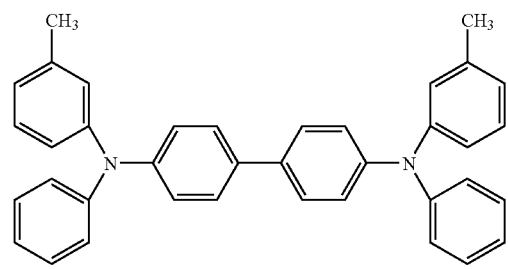

TPD

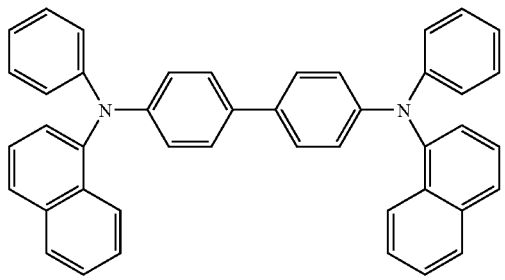

a-NPD

-continued
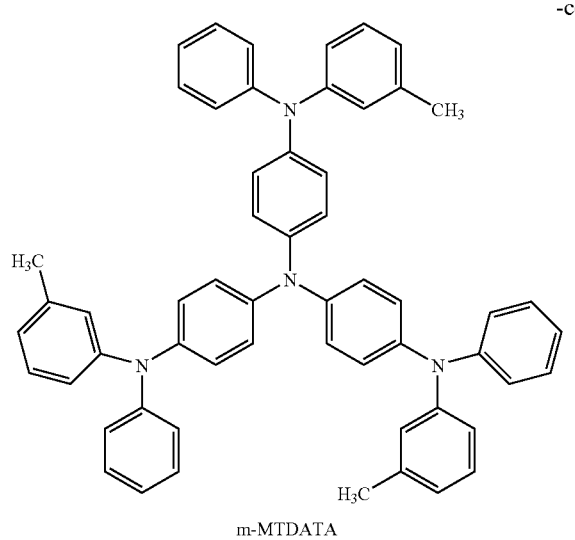
m-MTDATA
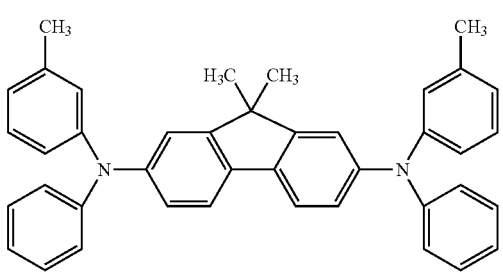
DTDPFL
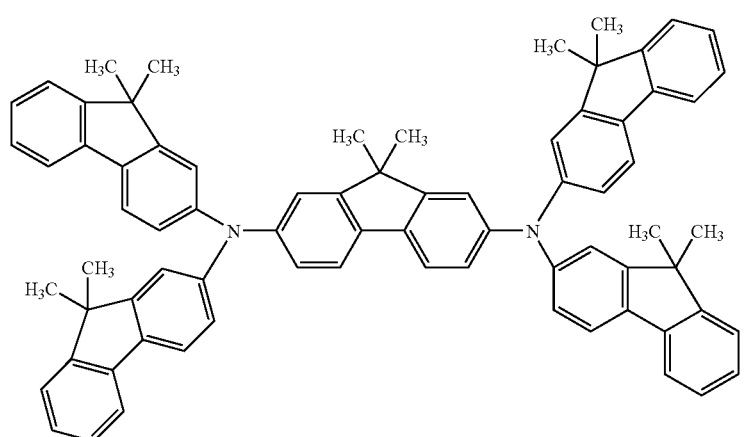
TFLFL
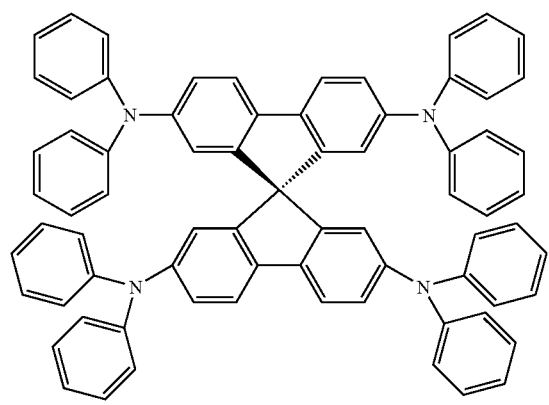
spiro-TPD
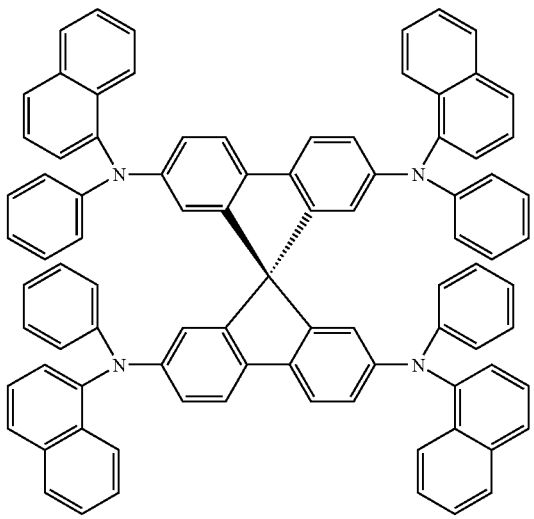
spiro-NPD 55
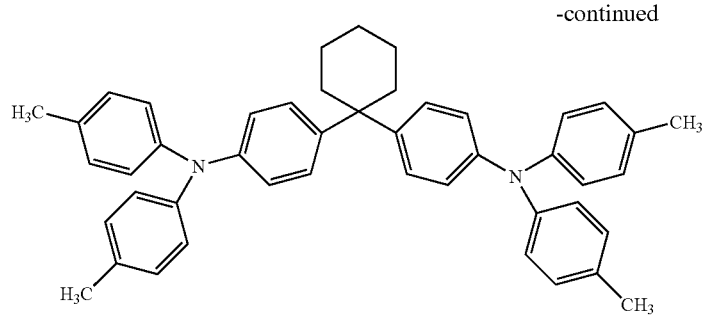
TPAC
56
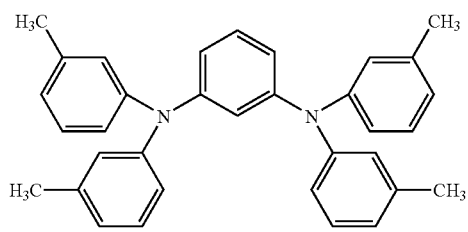
PDA
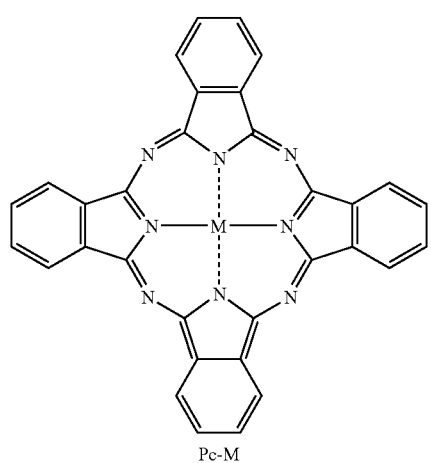
Pc-M
M: Cu, Mg, AlCl, TiO, SiCl$_2$, Zn, Sn, MnCl, GaCl, etc.
<High Molecular Hole Injecting/Transporting Materials>
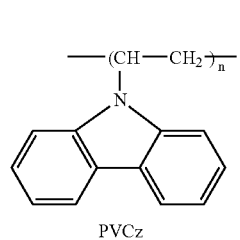
PVCz
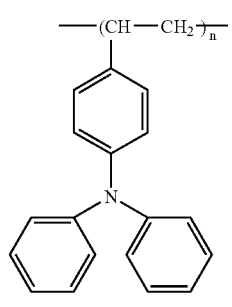
DPA-PS
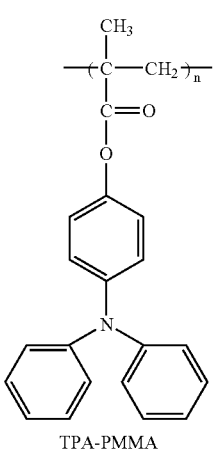
TPA-PMMA -continued
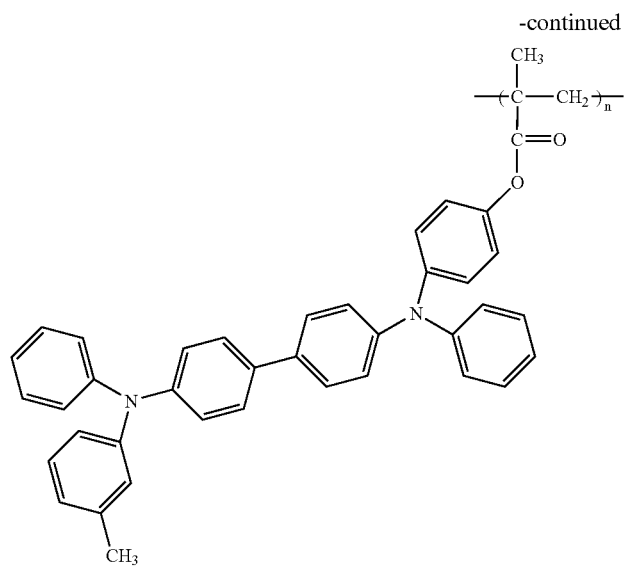
TPD-PMMA
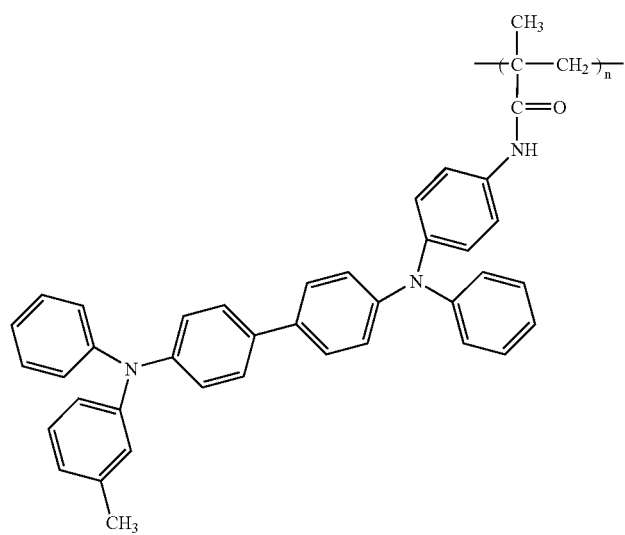
TPD-PMAA
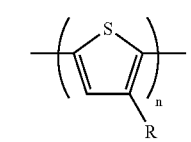
R: $C_6H_{13}$, $C_8H_{17}$, $C_{12}H_{25}$
Poly thiophene
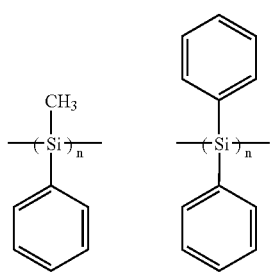
Polysilane -continued

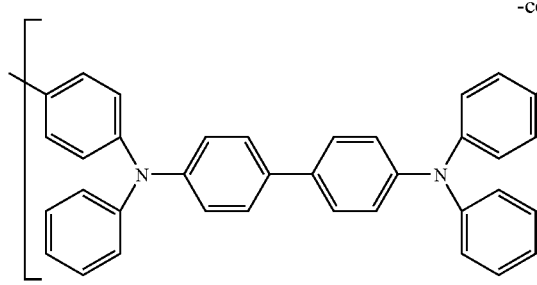
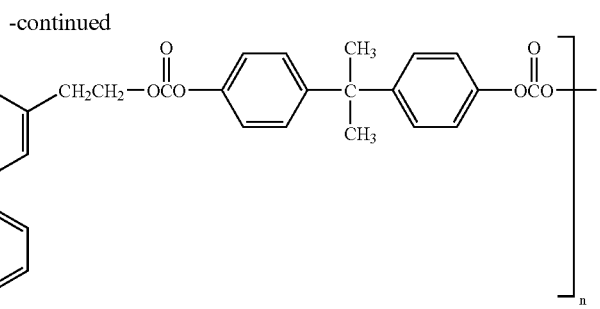

TPD-PCA

The electron injecting/transporting material can be arbitrarily selected from those materials which facilitate injection of electrons from a cathode and have a function of transporting the injected electrons to a light-emitting layer, and is selected in consideration of a balance with the carrier mobility of the hole-transporting material. Examples of the material having electron injecting/transporting capability include, but is not limited to, an oxadiazole derivative, an oxazole derivative, a thiazole derivative, a thiadiazole derivative, a pyrazine derivative, a triazole derivative, a triazine derivative, a perylene derivative, a quinoline derivative, a quinoxaline derivative, a fluorenone derivative, an anthrone derivative, a phenanthroline derivative and an organometallic complex. Representative examples will be shown below.

-continued

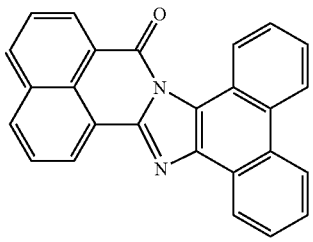

TAZ

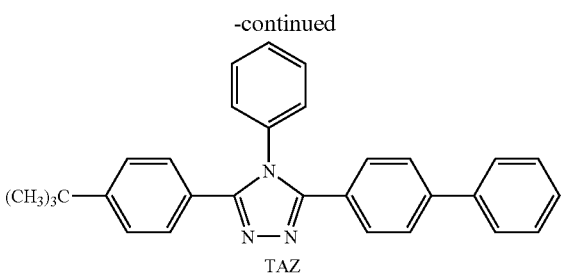

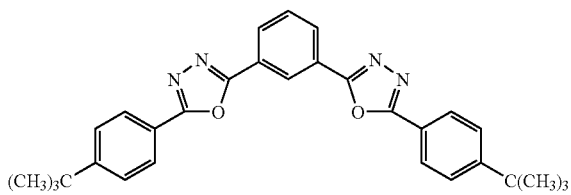

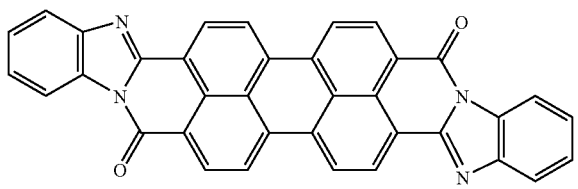

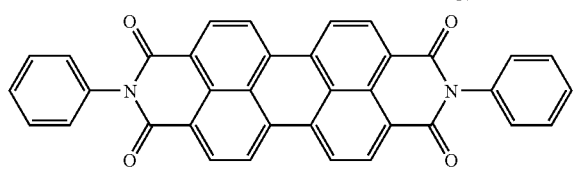

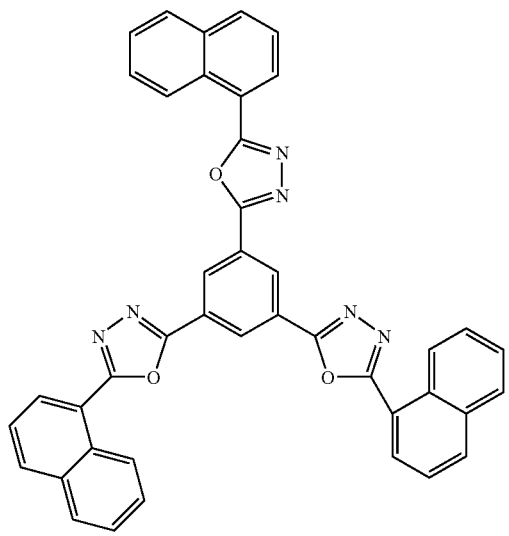

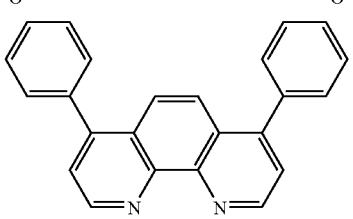

Bphen

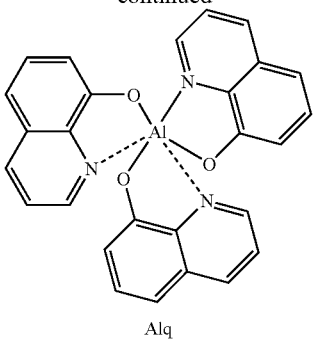

Alq

A layer containing an organic compound in the organic light-emitting device of the present invention is a thin film generally formed with vacuum deposition method, ion plating method, sputtering, plasma CVD, or a well-known method of applying the organic compound dissolved in a suitable solvent (such as spin coating, dipping, casting, LB method, ink jet method). Particularly, when the film is formed with the application method, the film can be formed by additionally using a suitable binder resin.

The above described binder resin can be selected from a wide range of binding resins, and includes, for instance, polyvinylcarbazole resin, polycarbonate resin, polyester resin, polyarylate resin, polystyrene resin, ABS resin, polybutadiene resin, polyurethane resin, acrylic resin, methacrylic resin, butyral resin, polyvinylacetal resin, polyamide resin, polyimide resin, polyethylene resin, polyether sulfonic resin, diallylphthalate resin, phenolic resin, epoxy resin, silicone resin, polysulfonic resin and urea resin, but is not limited to them. In addition, the binder resin may be singly used, or be used in combination as a copolymer. Furthermore, an additive such as a well-known plasticizer, antioxidant, and ultraviolet absorber, as needed.

An anode material used preferably has as large a work function as possible, and includes, for instance, an elemental metal such as gold, platinum, silver, copper, nickel, palladium, cobalt, selenium, vanadium and tungsten, an alloy thereof, and a metal oxide such as stannic oxide, zinc oxide, indium oxide, indium tin oxide (ITO) and indium zinc oxide. Further, a conductive polymer such as polyaniline, polypyrrole, polythiophene and polyphenylene sulfide can be employed. These electrode materials can be used singly or in combination. In addition, the anode may be either of a single layer configuration or of a multilayer configuration.

On the other hand, a cathode material used preferably has a low work function, and include, for instance an elemental metal such as lithium, sodium, potassium, calcium, magnesium, aluminum, indium, ruthenium, titanium, manganese, yttrium, silver, lead, tin, and chromium; or an alloy made of a plurality of the above metals, such as lithium-indium, sodium-potassium, magnesium-silver, aluminum-lithium, aluminum-magnesium, and magnesium-indium. A metal oxide such as indium tin oxide (ITO) can be also used. These electrode materials can be used singly or in combination. In addition, the cathode may be either of a single layer configuration or of a multilayer configuration.

Further, it is preferred that at least one of an anode and a cathode is transparent or translucent.

A substrate used in the present invention is not particularly limited, but an opaque substrate such as a metal substrate and a ceramic substrate or a transparent substrate such as glass, quartz, and a plastic sheet is used. Further, it is also possible to employ, for a substrate, a color filter film, a fluorescent color conversion filter film and a dielectric reflective film to thereby control the emission color. In addition, it is also possible to provide a thin film transistor (TFT) on the substrate and form a device by connecting thereto.

Further, as to the direction in which light is taken out of the device, any one of a bottom emission configuration (configuration in which light is taken out from a substrate side) and a top emission configuration (configuration in which light is taken out from a side opposite to the substrate side) may be adopted as needed.

Incidentally, after a device has been produced, a protective layer or an encapsulation layer may further be provided, for the purpose of preventing contact with oxygen or moisture. Examples of such a protective layer include a diamond thin film; a film of an inorganic material such as a metal oxide and a metal nitride; a film of a polymer such as a fluororesin, poly-p-xylene, polyethylene, silicone resin, and polystyrene resin; and further a photocurable resin. Further, the produced device may also be covered with glass, a gas-impermeable film and a metal, or be packaged with a suitable encapsulation resin.

EXAMPLES

The present invention will be now described more in detail below with reference to examples, but the present invention is not limited to the examples.

Example 1

An organic light-emitting device having a structure shown in FIG. 3 was prepared with a method described below.

A transparent conductive support substrate was prepared which had a film of indium tin oxide (ITO) with a thickness of 120 nm as an anode 2 formed on a glass substrate 1 by a sputtering method. The transparent conductive support substrate was ultrasonically cleaned sequentially with acetone and isopropyl alcohol (IPA), subsequently cleaned with boiled IPA, was dried, was further cleaned with UV/ozone, and was used.

A chloroform solution of a compound represented by the following structural formula, which was a hole-transporting material, was prepared so that the concentration became 0.2 wt. %.

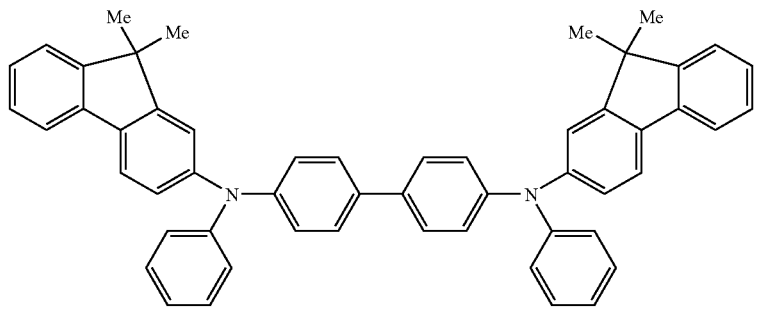

The solution was dropped on the above described ITO electrode and spin-coated at first for ten seconds at a rotation speed of 500 RPM and then for one minute at a rotation speed of 1,000 RPM, to form a film. The substrate was dried in a vacuum oven at 80° C. for ten minutes to completely remove the solvent in the thin film. The formed hole-transporting layer 5 had a thickness of 25 nm.

Subsequently, a light-emitting layer 3 with a thickness of 20 nm was provided on the hole-transporting layer 5 by co-depositing the above exemplified compound No. 3 as the first compound and the above exemplified compound No. 101 as the second compound (weight ratio: 10:90). As for the vapor depositing conditions in forming the film, the vacuum degree was 1.0×10-4 Pa and the film-forming rate was 0.2 to 0.3 nm/sec.

Furthermore, an electron-transporting layer 6 made of bathophenanthroline (BPhen) was formed into a film thickness of 50 nm through a vacuum deposition method. As for the vapor depositing conditions, the vacuum degree was $1.0 \times 10^{-4}$ Pa and the film-forming rate was 0.2 to 0.3 nm/sec.

Then, an organic light-emitting device was prepared by the subsequent steps of: forming a film of lithium fluoride (LiF) with a thickness of 0.5 nm on the above described organic layer by a vacuum deposition method; and further providing an aluminum film with a thickness of 150 nm thereon by a vacuum deposition method to make it an electron-injecting electrode (cathode 4). As for the vapor depositing conditions in forming the films, the vacuum degree was $1.0 \times 10^{-4}$ Pa, the film-forming rate for lithium fluoride was 0.05 nm/sec and the film-forming rate for aluminum was 1.0 to 1.2 nm/sec.

The thus obtained organic electroluminescent device was covered with a protective glass plate in a dry air atmosphere so that the device was not degraded through adsorbing moisture, and was encapsulated with an acrylic resin adhesive.

A voltage of 4.0 V was applied to thus obtained device with the ITO electrode (anode 2) being used as a positive electrode and the aluminum electrode (cathode 4) being used as a negative electrode. As a result, emission of a green light was observed which had a peak emission wavelength of 520 nm originating from the exemplified compound No. 3, at an emission luminance of 640 cd/m² with an emission efficiency of 10 lm/W.

Furthermore, a voltage was applied to the device in nitrogen atmosphere for 100 hours so that the current density was kept at 30 mA/cm². As a result, the device emitted light at a luminance of about 3,800 cd/m² in an early stage and at about 2,700 cd/m² after elapse of 100 hours, which meant that the luminance degradation was very small.

In addition, the absorption spectrum in ultraviolet to visible light region was measured on the device, and as a result, the second compound had a larger bandgap than the first compound had.

Examples 2 to 4

Devices were prepared by following the same procedure as in Example 1 with the exception that the exemplified compound No. 3 was used as the first compound and the compounds shown in Table 1 below were used as the second compound, and were similarly evaluated. The results are shown in Table 1.

TABLE 1

| Example No. | Exemplified compound No. of second compound | Applied voltage (V) | Luminance (cd/m²) | Efficiency (lm/W) |
|---|---|---|---|---|
| 2 | 107 | 4.0 | 2180 | 11 |
| 3 | 201 | 4.0 | 3050 | 12 |
| 4 | 202 | 4.0 | 1380 | 11 |

Any device of Examples 2 to 4 emitted a green light having a peak wavelength in the vicinity of 520 nm originating from the exemplified compound No. 3.

In addition, the absorption spectra in ultraviolet to visible light region were measured on the devices, and as a result, the second compounds each had a larger bandgap than the first compound had in any Example.

Examples 5 to 8

Devices were prepared by following the same procedure as in Example 1 with the exception that the exemplified compound No. 5 was used as the first compound, the compounds shown in Table 2 below were used as the second compound, the codeposition ratio at the time of forming the light-emitting layer was set to 25:75 (weight ratio), and 2,9-bis[2-(9,9-dimethylfluorenyl)]phenanthroline was used for the electron-transporting layer; and were similarly evaluated. The results are shown in Table 2.

TABLE 2

| Example No. | Exemplified compound No. of second compound | Applied voltage (V) | Luminance (cd/m²) | Efficiency (lm/W) |
|---|---|---|---|---|
| 5 | 101 | 4.0 | 770 | 12 |
| 6 | 107 | 4.0 | 2600 | 13 |
| 7 | 201 | 4.0 | 3620 | 14 |
| 8 | 212 | 4.0 | 1620 | 13 |

Any device of Examples 5 to 8 emitted a green light having a peak wavelength in the vicinity of 530 nm originating from the exemplified compound No. 5.

Furthermore, a voltage was applied to the device of Example 7 in nitrogen atmosphere for 100 hours so that the current density was kept at 30 mA/cm². As a result, the device emitted light at a luminance of about 5,400 cd/m² in an early stage and at about 4,500 cd/m² after elapse of 100 hours, which meant that the luminance degradation was very small.

In addition, the absorption spectra in ultraviolet to visible light region were measured on the devices, and as a result, the second compounds each had a larger bandgap than the first compound had in any Example.

Examples 9 to 12

Devices were prepared by following the same procedure as in Example 5 with the exception that the exemplified compound No. 57 was used as the first compound, the compounds shown in Table 3 below were used as the second compound, and the codeposition ratio at the time of forming the light-emitting layer was set to 30:70 (weight ratio); and were similarly evaluated. The results are shown in Table 3.

TABLE 3

| Example No. | Exemplified compound No. of second compound | Applied voltage (V) | Luminance (cd/m$^2$) | Efficiency (lm/W) |
|---|---|---|---|---|
| 9 | 101 | 4.0 | 700 | 11 |
| 10 | 107 | 4.0 | 2430 | 13 |
| 11 | 201 | 4.0 | 3390 | 13 |
| 12 | 212 | 4.0 | 1510 | 12 |

Any device of Examples 9 to 12 emitted a green light having a peak wavelength in the vicinity of 525 nm originating from the exemplified compound No. 57.

Furthermore, a voltage was applied to the device of Example 11 in nitrogen atmosphere for 100 hours so that the current density was kept at 30 mA/cm$^2$. As a result, the device emitted light at a luminance of about 5,100 cd/m$^2$ in an early stage and at about 4,300 cd/m$^2$ after elapse of 100 hours, which meant that the luminance degradation was very small.

In addition, the absorption spectra in ultraviolet to visible light region were measured on the devices, and as a result, the second compounds each had a larger bandgap than the first compound had in any Example.

Examples 13 to 16

Devices were prepared by following the same procedure as in Example 1 with the exception that the compounds shown in Table 4 were used as the first compound, the exemplified compound No. 201 was used as the second compound, and the codeposition ratio at the time of forming the light-emitting layer was set to 25:75 (weight ratio); and were similarly evaluated. The results are shown in Table 4.

TABLE 4

| Example No. | Exemplified compound No. of first compound | Applied voltage (v) | Peak emission wavelength (nm) | Luminance (cd/m$^2$) | Efficiency (lm/W) |
|---|---|---|---|---|---|
| 13 | 14 | 4.0 | 475 | 1660 | 7 |
| 14 | 55 | 4.0 | 515 | 2770 | 11 |
| 15 | 56 | 4.0 | 530 | 3160 | 12 |
| 16 | 77 | 4.0 | 475 | 1470 | 6 |

In addition, the absorption spectra in ultraviolet to visible light region were measured on the devices, and as a result, the second compound had a larger bandgap than the first compounds had in each Example.

Comparative Example 1

Devices were prepared by following the same procedure as in Example 1 with the exception that the compound shown below was used as the first compound, the exemplified compound No. 201 was used as the second compound, and the codeposition ratio at the time of forming the light-emitting layer was set to 25:75 (weight ratio); and were similarly evaluated.

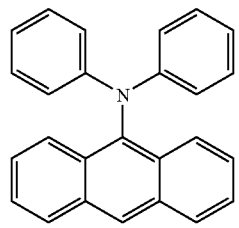

When a voltage of 4.0 V was applied to the device, emission of a green light was observed which had a peak emission wavelength of 505 nm, at an emission luminance of 610 cd/m$^2$ with an emission efficiency of 21 m/W.

Furthermore, a voltage was applied to the device in nitrogen atmosphere for 100 hours so that the current density was kept at 30 mA/cm$^2$. As a result, the device emitted light at a luminance of about 920 cd/m$^2$ in an early stage and of about 450 cd/m$^2$ after elapse of 100 hours, which meant that the luminance degradation was large.

Comparative Example 2

Devices were prepared by following the same procedure as in Example 1 with the exception that the compound shown below was used as the first compound, the exemplified compound No. 201 was used as the second compound, and the codeposition ratio at the time of forming the light-emitting layer was set to 25:75 (weight ratio); and were similarly evaluated.

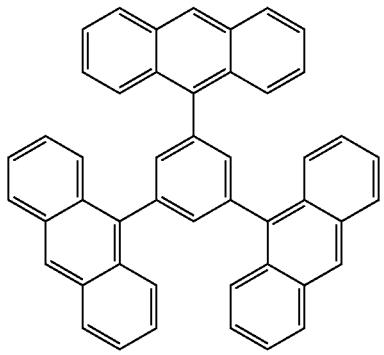

When a voltage of 4.0 V was applied to the device, emission of a blue light was observed which had a peak emission wavelength of 465 nm, at an emission luminance of 280 cd/m$^2$ with an emission efficiency of 11 m/W.

In addition, the absorption spectrum in ultraviolet to visible light region was measured on the device, and as a result, the second compound had a smaller bandgap than the first compound had.

This application claims priority from Japanese Patent Application No. 2004-342462 filed Nov. 26, 2004, which is hereby incorporated by reference herein.

What is claimed is:
1. An organic light-emitting device comprising:
a light-emitting layer; and
an electron-transporting layer,
wherein the light-emitting layer comprises a first compound represented by the following structural formula:

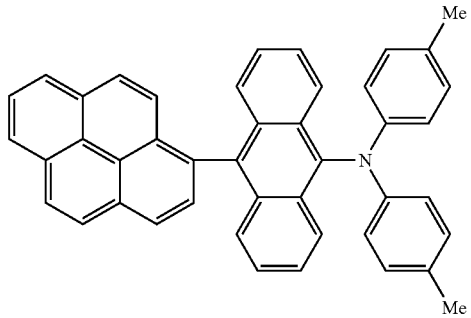

and a second compound represented by the following structural formula:

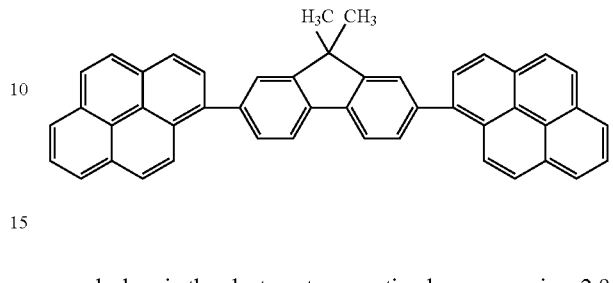

and wherein the electron-transporting layer comprises 2,9-bis[2-(9,9-dimethylfluorenyl)]phenanthroline.

* * * * *